(12) United States Patent
Ohashi et al.

(10) Patent No.: US 11,530,481 B2
(45) Date of Patent: Dec. 20, 2022

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: KOKUSAI ELECTRIC CORPORATION, Tokyo (JP)

(72) Inventors: Naofumi Ohashi, Toyama (JP); Hidehiro Yanai, Toyama (JP); Tadashi Takasaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/985,552

(22) Filed: Aug. 5, 2020

(65) Prior Publication Data

US 2021/0079525 A1 Mar. 18, 2021

(30) Foreign Application Priority Data

Sep. 12, 2019 (JP) .............................. JP2019-165950

(51) Int. Cl.
*C23C 16/455* (2006.01)
*H01L 21/67* (2006.01)
*C23C 16/458* (2006.01)
*H01L 21/687* (2006.01)
*C23C 16/46* (2006.01)

(52) U.S. Cl.
CPC .... *C23C 16/45563* (2013.01); *C23C 16/4584* (2013.01); *C23C 16/4586* (2013.01);
(Continued)

(58) Field of Classification Search
CPC ........ C23C 16/45578; C23C 16/45563; C23C 16/45523; C23C 16/46; C23C 16/4586;
(Continued)

(56) References Cited

U.S. PATENT DOCUMENTS

2008/0075838 A1* 3/2008 Inoue ................ H01L 21/02238
118/715
2011/0186984 A1* 8/2011 Saito ........................ C23C 16/52
257/E23.012
(Continued)

FOREIGN PATENT DOCUMENTS

CN 105568255 A 5/2016
JP 2010219125 A * 9/2010 ........... C23C 16/402
(Continued)

OTHER PUBLICATIONS

Taiwan Office Action dated Mar. 10, 2021 for Taiwan Patent Application No. 109125937.
(Continued)

*Primary Examiner* — Laura Edwards
(74) *Attorney, Agent, or Firm* — Volpe Koenig

(57) ABSTRACT

Described herein is a technique capable of improving a uniformity of the characteristics of a film formed on a surface of a substrate by a rotary type apparatus. According to one aspect of the technique, there is provided a substrate processing apparatus including: a process chamber in which a substrate is processed; a substrate support provided in the process chamber and including a plurality of placement parts on which the substrate is placed; a main nozzle provided so as to face a placement part among the plurality of the placement parts and including a first portion where no hole is provided so as to thermally decompose a process gas; and an auxiliary nozzle provided so as to face the placement part and including a second portion where no hole is provided so as to thermally decompose the process gas.

13 Claims, 12 Drawing Sheets

(52) U.S. Cl.
CPC .. *C23C 16/45523* (2013.01); *C23C 16/45551* (2013.01); *C23C 16/45574* (2013.01); *C23C 16/45578* (2013.01); *C23C 16/46* (2013.01); *H01L 21/67109* (2013.01); *H01L 21/68764* (2013.01); *H01L 21/68771* (2013.01)

(58) Field of Classification Search
CPC .......... C23C 16/4412; C23C 16/45551; C23C 16/45574; C23C 16/4584; C23C 16/345; H01L 21/67109; H01L 21/68764; H01L 21/68771; H01L 21/68785; H01L 21/67017; H01L 21/67103; H01L 21/68742; H01J 37/3244
USPC .......................................... 118/715, 719, 725
See application file for complete search history.

(56) References Cited

U.S. PATENT DOCUMENTS

| | | | | |
|---|---|---|---|---|
| 2011/0312188 | A1* | 12/2011 | Wamura | C23C 16/52 438/758 |
| 2012/0280369 | A1* | 11/2012 | Saito | H01L 28/60 257/629 |
| 2015/0093518 | A1* | 4/2015 | Yonenaga | C23C 16/4586 427/591 |
| 2016/0122873 | A1 | 5/2016 | Iwasaki et al. | |
| 2016/0240413 | A1* | 8/2016 | Kobayashi | H01L 21/67051 |
| 2016/0289833 | A1* | 10/2016 | Okada | H01L 21/67109 |
| 2017/0183779 | A1* | 6/2017 | Ikegawa | C23C 16/45578 |
| 2017/0232457 | A1 | 8/2017 | Fujino et al. | |
| 2018/0355479 | A1* | 12/2018 | Karakawa | C23C 16/45551 |

FOREIGN PATENT DOCUMENTS

| | | | | |
|---|---|---|---|---|
| JP | 2017-034013 | A | | 2/2017 |
| JP | 2017-147262 | A | | 8/2017 |
| JP | 2017157577 | A | * 9/2017 | ........... H01L 21/205 |
| JP | 2017157744 | A | * 9/2017 | ............. C23C 16/46 |
| JP | 2018078233 | A | * 5/2018 | ....... H01L 21/02186 |

OTHER PUBLICATIONS

Korean Office Action dated Jan. 24, 2022 for Korean Patent Application No. 10-2020-0094448.

* cited by examiner

FIG. 6
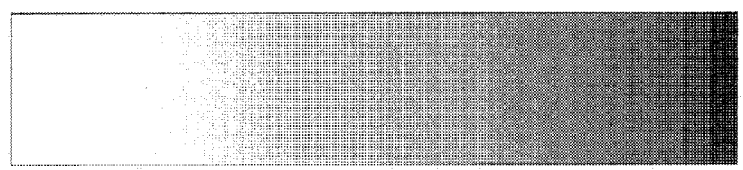
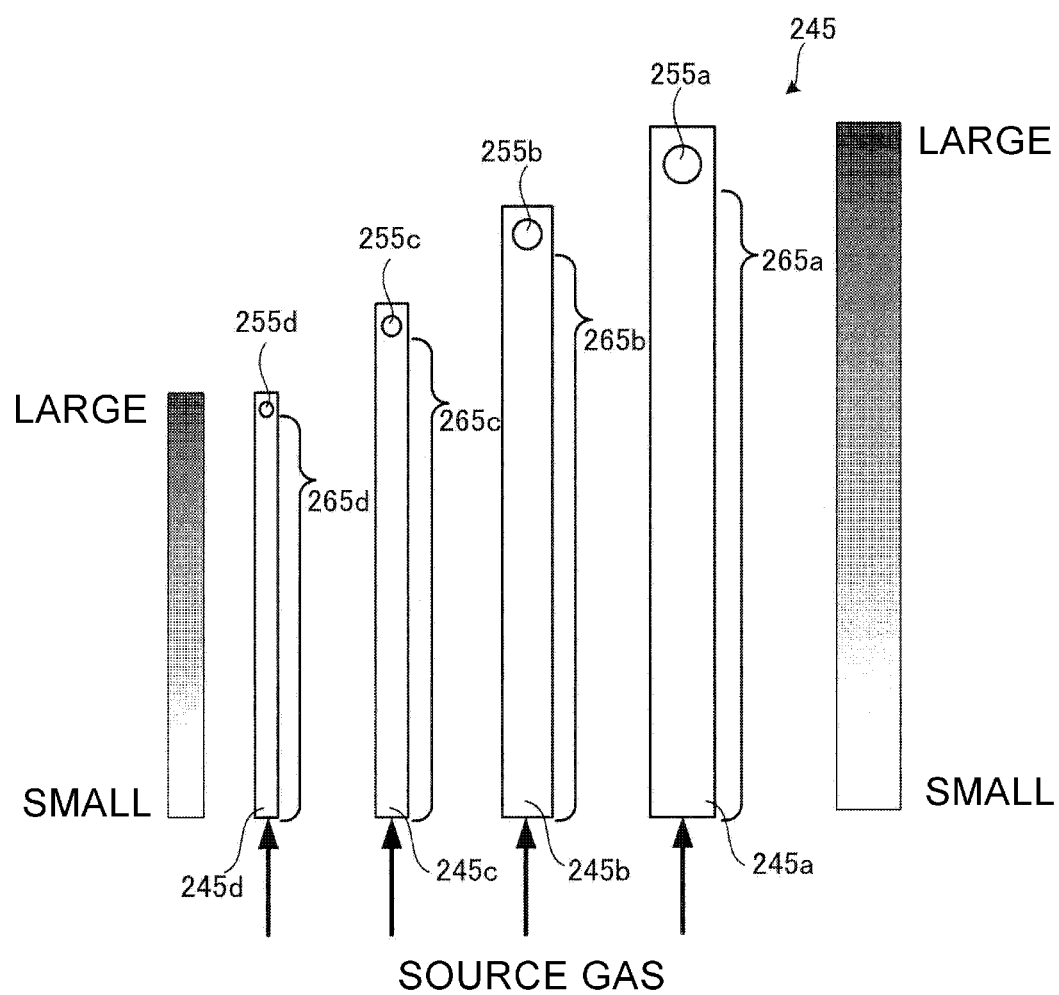

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2019-165950, filed on Sep. 12, 2019, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Related Art

As an apparatus of processing a semiconductor substrate, a rotary type apparatus may be used. For example, according to the rotary type apparatus, a plurality of substrates are arranged on a substrate support of the rotary type apparatus along a circumferential direction, and various gases are supplied onto the plurality of the substrates by rotating the substrate support. In addition, a vertical type apparatus may also be used. For example, according to the vertical type apparatus, a source gas is supplied onto a plurality of substrates stacked in the vertical type apparatus by using a source gas nozzle extending along a stacking direction of the plurality of the substrates stacked in the vertical type apparatus.

According to the rotary type apparatus, for example, the plurality of the substrates including a substrate of 300 mm are arranged along the circumferential direction, and a heat treatment process may be performed to the plurality of the substrates arranged on the substrate support. Therefore, for example, when the source gas is supplied by using an I-shaped nozzle, the source gas supplied to the plurality of the substrates may be thermally decomposed in the I-shaped nozzle as a temperature of the rotary type apparatus increases. As a result, a thickness of a film formed on a surface of each of the plurality of the substrates may vary along a radial direction of the substrate.

SUMMARY

Described herein is a technique capable of improving a uniformity of the characteristics of a film formed on a surface of a substrate by a rotary type apparatus According to one aspect of the technique of the present disclosure, there is provided a substrate processing apparatus including: a process chamber in which a substrate is processed; a substrate support provided in the process chamber and including a plurality of placement parts on which the substrate is placed; a main nozzle provided so as to face a placement part among the plurality of the placement parts and including a first portion where no hole is provided so as to thermally decompose a process gas; and an auxiliary nozzle provided so as to face the placement part and including a second portion where no hole is provided so as to thermally decompose the process gas.

DETAILED DESCRIPTION

Hereinafter, one or more embodiments (also simply referred to as "embodiments") according to the technique of the present disclosure will be described with reference to the drawings.

First Embodiment

(1) Configuration of Substrate Processing Apparatus

Figure 1:
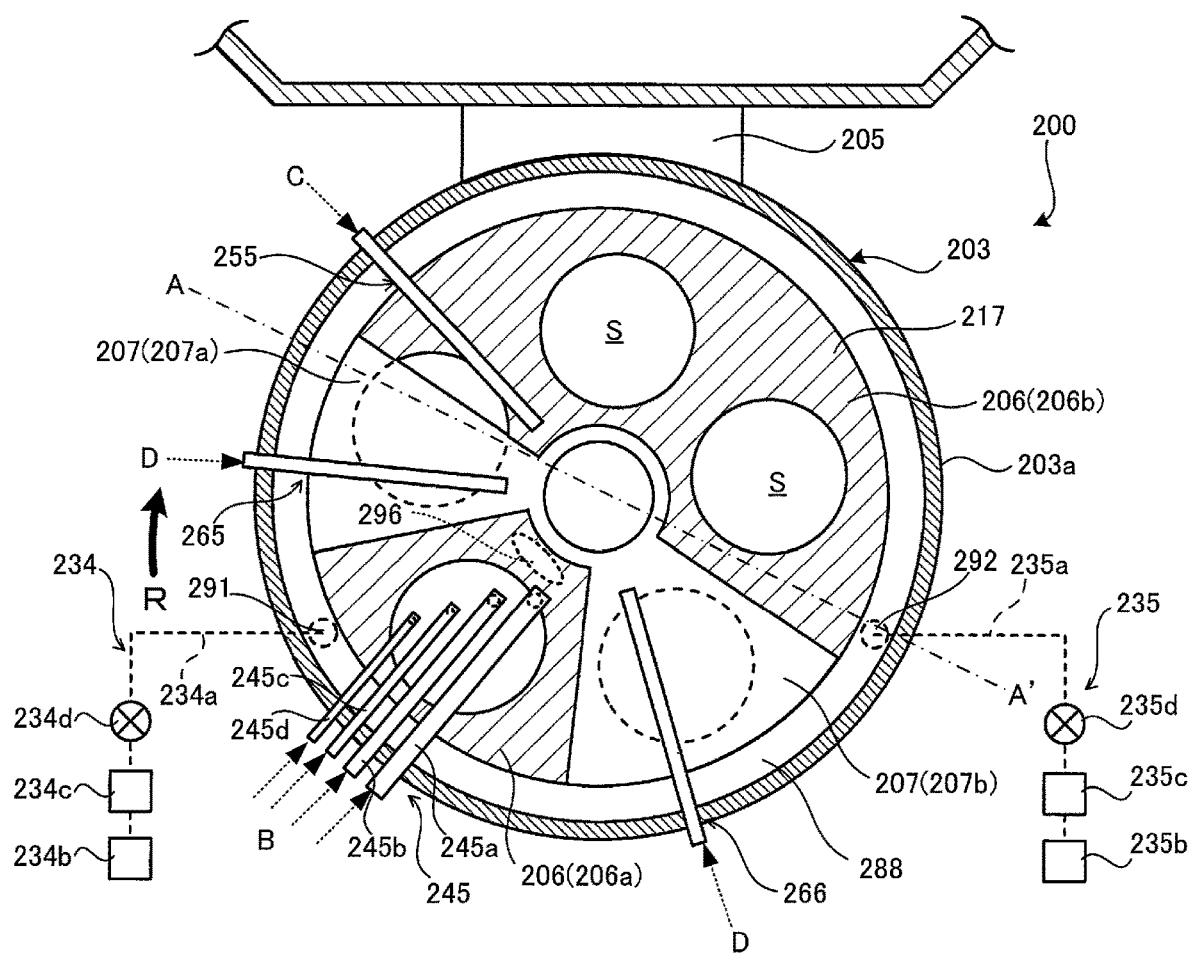
FIG. 1 schematically illustrates a horizontal cross-section of a reactor of a substrate processing apparatus according to a first embodiment described herein.
Figure 2:
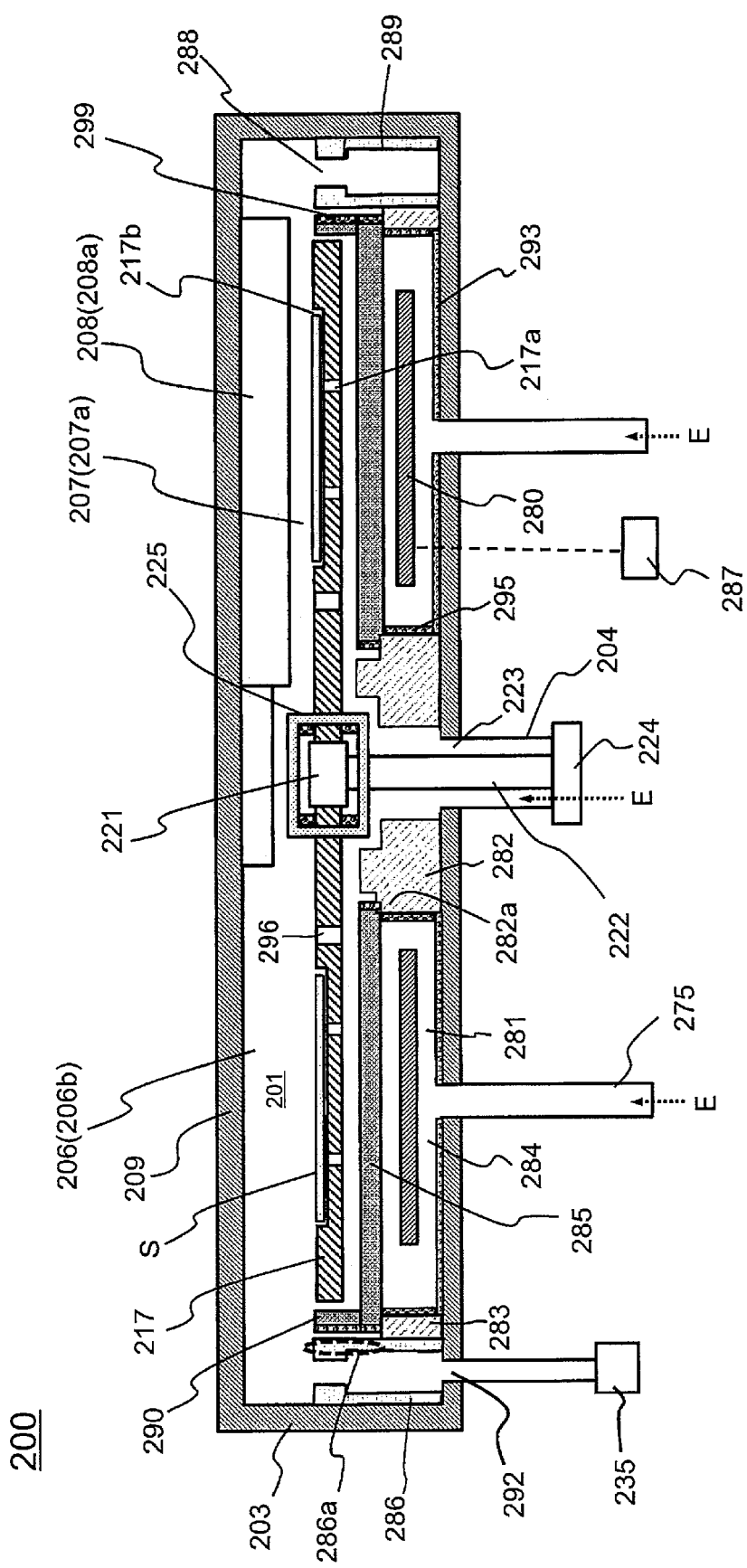
FIG. 2 schematically illustrates a vertical cross-section taken along the line A-A' of the reactor of the substrate processing apparatus according to the first embodiment shown in FIG. 1.

As shown in FIGS. 1 and 2, a reactor 200 of a substrate processing apparatus (also referred to a "rotary type apparatus") includes a process vessel 203 which is a cylindrical sealed vessel (hermetic vessel). For example, the process vessel 203 is made of a material such as stainless steel (SUS) and an aluminum alloy. A process chamber 201 in which a plurality of substrates including a substrate S are processed is provided in the process vessel 203. A gate valve 205 is connected to the process vessel 203. The substrate S is loaded (transferred) into or unloaded (transferred) out of the process vessel 203 through the gate valve 205.

The process chamber 201 includes a process region 206 to which a process gas such as a source gas and a reactive gas is supplied and a purge region 207 to which a purge gas is supplied. According to the first embodiment, the process region 206 and the purge region 207 are alternately arranged along a circumferential direction of the process chamber 201. For example, a first process region 206a, a first purge region 207a, a second process region 206b and a second purge region 207b are arranged along the circumferential direction in this order. As described later, for example, the source gas is supplied into the first process region 206a, the reactive gas is supplied into the second process region 206b, and an inert gas serving as the purge gas is supplied into the first purge region 207a and the second purge region 207b. As a result, a predetermined processing (substrate processing) is performed to the substrate S in accordance with the gas supplied into each region.

The purge region 207 is configured to spatially separate the first process region 206a and the second process region 206b. A ceiling 208 of the purge region 207 is disposed lower than a ceiling 209 of the process region 206. Specifically, a ceiling 208a is provided at the first purge region 207a, and a ceiling 208b is provided at the second purge region 207b. By lowering each of the ceilings such as the ceiling 208a and the ceiling 208b, it is possible to increase a pressure of a space of the purge region 207. By supplying the purge gas into the space of the purge region 207, it is possible to partition the adjacent process region 206 (that is, the first process region 206a and the second process region 206b). In addition, the purge gas is configured to remove excess gases on the substrate S.

A rotary table 217 configured to be rotatable is provided at a center portion of the process vessel 203. A rotating shaft of the rotary table 217 is provided at a center of the process vessel 203. For example, the rotary table 217 is made of a material such as quartz, carbon and silicon carbide (SiC) such that the substrate S is not affected by the metal contamination.

The rotary table 217 is configured such that the plurality of the substrates (for example, five substrates) including the substrate S can be arranged within the process vessel 203 on the same plane and along the same circumference along a rotational direction "R". In the present specification, the term "the same plane" is not limited to a perfectly identical plane but may also include a case where, for example, the plurality of the substrates including the substrate S are arranged so as not to overlap with each other when viewed from above.

A plurality of concave portions (also simply referred to as "concave portions") 217b serving as placement parts are provided on a surface of the rotary table 217 to support the plurality of the substrates including the substrate S. The number of the concave portions 217b is equal to the number of the substrates to be processed. For example, the plurality of the concave portions 217b are arranged at the same distance from a center of the rotary table 217, and are arranged along the same circumference at equal intervals (for example, 72° intervals). In FIG. 1, the illustration of the plurality of the concave portions 217b is omitted for simplification.

Each of the concave portions 217b is of a circular shape when viewed from above and of a concave shape when viewed by a vertical cross-section thereof. It is preferable that a diameter of each of the concave portions 217b is slightly greater than a diameter of the substrate S. A plurality of substrate placing surfaces are provided respectively at the bottoms of the plurality of the concave portions 217b. For example, the substrate S may be placed on the substrate placing surface by being placed on one of the concave portions 217b. Through-holes 217a penetrated by pins 219 described later are provided at each of the substrate placing surfaces.

Figure 3:
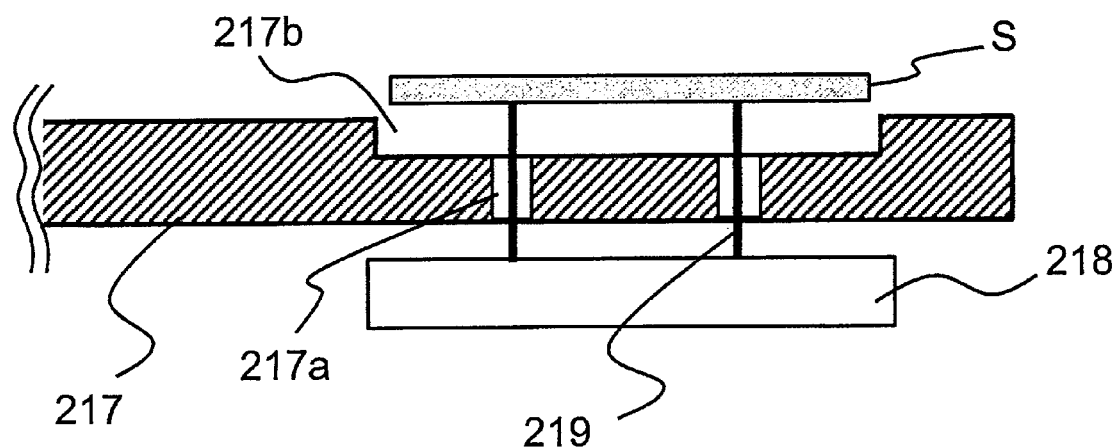
FIG. 3 schematically illustrates a substrate support mechanism according to the first embodiment described herein.

A substrate support mechanism 218 shown in FIG. 3 is provided in the process vessel 203 at a position below the rotary table 217 and facing the gate valve 205. The substrate support mechanism 218 includes the pins 219 configured to elevate or lower the substrate S and to support a back surface of the substrate S when the substrate S is loaded into or unloaded out of the process chamber 201. The pins 219 may be of an extendable configuration. For example, the pins 219 may be accommodated in a main body of the substrate support mechanism 218. When the substrate S is transferred, the pins 219 are extended and pass through the through-holes 217a. Thereby, the substrate S is supported by the pins 219. Thereafter, by moving front ends of the pins 219 downward, the substrate S is placed on one of the concave portions 217b. For example, the substrate support mechanism 218 is fixed to the process vessel 203. The substrate support mechanism 218 may be embodied by any configuration as long as the pins 219 can be inserted into the through-holes 217a when the substrate S is placed, and may also be fixed to an inner peripheral convex portion 282 or an outer peripheral convex portion 283 described later.

The rotary table 217 is fixed to a core portion 221. The core portion 221 is provided at the center of the rotary table 217 and configured to fix the rotary table 217. Since the core portion 221 supports the rotary table 217, for example, the core portion 221 is made of a metal that can withstand the weight of the rotary table 217. A shaft 222 is provided below the core portion 221. The shaft 222 supports the core portion 221.

A lower portion of the shaft 222 penetrates a hole 223 provided at a bottom of the process vessel 203, and a vessel 204 capable of hermetically sealing the shaft 222 covers a periphery of the lower portion of the shaft 222. The vessel 204 is provided outside the process vessel 203. A lower end of the shaft 222 is connected to a rotating part (also referred to as a "rotating mechanism") 224. The rotating part 224 is provided with components such as a rotating shaft (not shown) and a motor (not shown), and is configured to rotate the rotary table 217 according to an instruction from a controller 300 described later. That is, the controller 300 controls the rotating part 224 to rotate the rotary table 217 about a point (for example, about the center of the core portion 221) provided outside the substrate S, so that the substrate S sequentially passes through the first process region 206a, the first purge region 207a, the second process region 206b and the second purge region 207b in this order.

A quartz cover 225 is provided so as to cover the core portion 221. That is, the quartz cover 225 is provided between the core portion 221 and the process chamber 201. The quartz cover 225 is configured to cover the core portion 221 via a space between the core portion 221 and the process chamber 201. For example, the quartz cover 225 is made of a material such as quartz and SiC such that the substrate S is not affected by the metal contamination. The core portion 221, the shaft 222, the rotating part 224 and the quartz cover 225 may be collectively referred to as a "support part".

A heater mechanism 281 is provided below the rotary table 217. A plurality of heaters including a heater 280 serving as a heating device are embedded in the heater mechanism 281. The plurality of heaters including the heater 280 are configured to heat the plurality of the substrate including the substrate S placed on the rotary table 217, respectively. The plurality of the heaters including the heater 280 are arranged along the same circumference in accordance with a shape of the process vessel 203.

The heater mechanism 281 is constituted mainly by: the inner peripheral convex portion 282 provided on the bottom of the process vessel 203 and on the center portion of the process vessel 203; the outer peripheral convex portion 283 disposed outside the heater 280; and the heater 280. The inner peripheral convex portion 282, the heater 280 and the outer peripheral convex portion 283 are arranged concentrically. A space 284 is provided between the inner peripheral convex portion 282 and the outer peripheral convex portion 283. The heater 280 is disposed in the space 284. Since the inner peripheral convex portion 282 and the outer peripheral convex portion 283 are fixed to the process vessel 203, the inner peripheral convex portion 282 and the outer peripheral convex portion 283 may be considered as a part of the process vessel 203.

While the first embodiment will be described by way of an example in which the heater 280 of a circular shape is used, the first embodiment is not limited thereto as long as the substrate S can be heated by the heater 280. For example, the heater 280 may be divided into a plurality of auxiliary heater structures. For example, the heater 280 may be embedded in the rotary table 217.

A flange 282a is provided at an upper portion of the inner peripheral convex portion 282 to face the heater 280. A window 285 is supported on upper surfaces of the flange 282a and the outer peripheral convex portion 283. For example, the window 285 is made of a material capable of transmitting the heat generated by the heater 280 such as quartz. The window 285 is fixed by interposing the window 285 between the inner peripheral convex portion 282 and an upper portion 286a of an exhaust structure 286 described later.

A heater controller (also referred to as a "heater temperature controller") 287 is connected to the heater 280. The heater controller 287 is electrically connected to the controller 300 described later, and is configured to control the supply of the electric power to the heater 280 according to an instruction from the controller 300 to perform a temperature control.

An inert gas supply pipe 275 communicating with the space 284 is provided at the bottom of the process vessel 203. The inert gas supply pipe 275 is connected to a second inert gas supply part 270 described later. The inert gas supplied through the second inert gas supply part 270 is supplied to the space 284 through the inert gas supply pipe 275. By setting the space 284 to an inert gas atmosphere, it is possible to prevent the process gas from entering the space 284 through a gap in the vicinity of the window 285.

The exhaust structure 286 made of a metal is disposed (provided) between an outer peripheral surface of the outer peripheral convex portion 283 and an inner peripheral surface of the process vessel 203. The exhaust structure 286 includes an exhaust groove 288 and an exhaust buffer space 289. Each of the exhaust groove 288 and the exhaust buffer space 289 is of a ring shape in accordance with the shape of the process vessel 203.

A portion of the exhaust structure 286 which is not in contact with the outer peripheral convex portion 283 is referred to as the upper portion 286a. As described above, the upper portion 286a is configured to fix the window 285 together with the inner peripheral convex portion 282.

According to the rotary type apparatus (also referred to as a "rotary type substrate processing apparatus") as in the first embodiment, it is preferable that a height of the substrate S is same as or close to a height of an exhaust port described later. When the height of the exhaust port is lower than that of the substrate S, a turbulent flow of the gas may occur at an end portion of the rotary table 217. On the other hand, it is possible to suppress the occurrence of the turbulent flow by setting the height of the substrate S to be the same as or close to the height of an exhaust port.

According to the first embodiment, an upper end of the exhaust structure 286 is provided at the same height as the rotary table 217. When the upper end of the exhaust structure 286 is provided at the same height as the rotary table 217, as shown in FIG. 2, a protrusion of the upper portion 286a protrudes from the window 285. To prevent the particles from diffusing, a quartz cover 290 is provided to cover the protrusion of the upper portion 286a. Without the quartz cover 290, the gas may come into contact with the upper portion 286a, corrode the upper portion 286a and generate the particles in the process chamber 201. A space 299 is provided between the quartz cover 290 and the upper portion 286a.

An exhaust port 291 and an exhaust port 292 are provided at a bottom of the exhaust structure 286. The exhaust port 291 and an exhaust port 292 serve as a first exhaust part (also referred to as a "first exhaust mechanism"). The source gas supplied into the first process region 206a and the purge gas supplied through an upstream side of the first process region 206a are mainly exhausted through the exhaust port 291. The reactive gas supplied into the second process region 206b and the purge gas supplied through an upstream side of the second process region 206b are mainly exhausted through the exhaust port 292. Each of the gases describe above is exhausted through the exhaust port 291 and the exhaust port 292 via the exhaust groove 288 and the exhaust buffer space 289.

Figure 4:
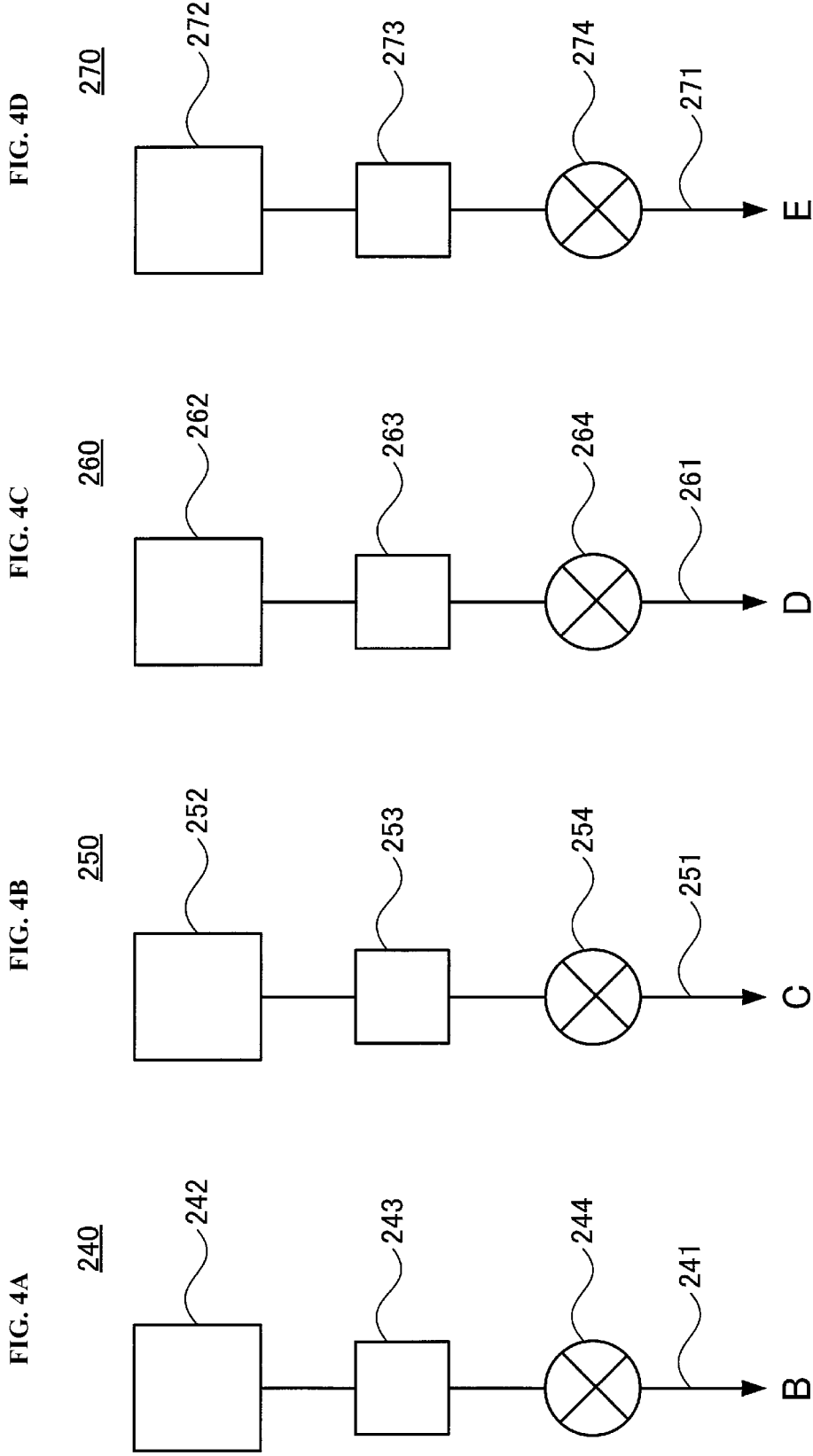
FIG. 4A schematically illustrates a source gas supply part according to the first embodiment described herein, FIG. 4B schematically illustrates a reactive gas supply part according to the first embodiment described herein, FIG. 4C schematically illustrates a first inert gas supply part according to the first embodiment described herein and FIG. 4D schematically illustrates a second inert gas supply part according to the first embodiment described herein.

Subsequently, a source gas supply part (also referred to as a "source gas supply mechanism" or a "source gas supply system") 240 will be described with reference to FIGS. 1 and 4A. As shown in FIG. 1, a nozzle 245 extending toward the center of the process vessel 203 penetrates a side of the process vessel 203. The nozzle 245 is provided in the first process region 206a. For example, the nozzle 245 is constituted by a plurality of nozzles, and a downstream end of a gas supply pipe 241 is connected to each of the plurality of the nozzles constituting the nozzle 245. The nozzle 245 will be described later in detail.

A source gas supply source 242, a mass flow controller (MFC) 243 serving as a flow rate controller (also referred to as a "flow rate control mechanism") and a valve 244 serving as an opening/closing valve are provided at the gas supply pipe 241 in the sequential order from an upstream side to a downstream side of the gas supply pipe 241.

The source gas is supplied into the first process region 206a through the nozzle 245 via the gas supply pipe 241 provided with the MFC 243 and the valve 244.

In the present specification, the source gas is one of process gases, and serves as a source when a film is formed. The source gas contains at least one element constituting the film. For example, the source gas contains at least one element among silicon (Si), titanium (Ti), tantalum (Ta), hafnium (Hf), zirconium (Zr), ruthenium (Ru), nickel (Ni), tungsten (W) and molybdenum (Mo).

Specifically, according to the first embodiment, for example, dichlorosilane ($Si_2H_2Cl_2$) gas may be used as the source gas. When a source of the source gas is a gaseous state under the normal temperature (room temperature), a gas mass flow controller is used as the MFC 243.

The source gas supply part (also referred to as a "first gas supply system" or a "first gas supply part") 240 is constituted mainly by the gas supply pipe 241, the MFC 243, the valve 244 and the nozzle 245. The source gas supply part 240 may further include the source gas supply source 242.

Subsequently, a reactive gas supply part (also referred to as a "reactive gas supply mechanism" or a "reactive gas supply system") 250 will be described with reference to FIGS. 1 and 4B. As shown in FIG. 1, a nozzle 255 extending toward the center of the process vessel 203 penetrates a side of the process vessel 203. The nozzle 255 is provided in the second process region 206b.

A gas supply pipe 251 is connected to the nozzle 255. A reactive gas supply source 252, an MFC 253 and a valve 254 are provided at the gas supply pipe 251 in the sequential order from an upstream side to a downstream side of the gas supply pipe 251.

The reactive gas is supplied into the second process region 206b through the nozzle 255 via the gas supply pipe 251 provided with the MFC 253 and the valve 254.

In the present specification, the reactive gas is one of the process gases, and refers to a gas that reacts with a first layer formed on the substrate S by supplying the source gas. For example, the reactive gas may include at least one among ammonia ($NH_3$) gas, nitrogen ($N_2$) gas, hydrogen ($H_2$) gas and oxygen ($O_2$) gas. Specifically, according to the first embodiment, for example, the $NH_3$ gas may be used as the reactive gas.

The reactive gas supply part (also referred to as a "second gas supply system" or a "second gas supply part") 250 is constituted mainly by the gas supply pipe 251, the MFC 253, the valve 254 and the nozzle 255. The reactive gas supply part 250 may further include the reactive gas supply source 252.

Subsequently, a first inert gas supply part (also referred to as a "first inert gas supply mechanism" or a "first inert gas supply system") 260 will be described with reference to FIGS. 1 and 4C. As shown in FIG. 1, each of a nozzle 265 and a nozzle 266 extending toward the center of the process vessel 203 penetrates a side of the process vessel 203. The nozzle 265 is provided in the first purge region 207a. For example, the nozzle 265 may be fixed to the ceiling 208a of the first purge region 207a. The nozzle 266 is provided in the second purge region 207b. For example, the nozzle 266 may be fixed to the ceiling 208b of the second purge region 207b.

A downstream end of an inert gas supply pipe 261 is connected to the nozzle 265 and the nozzle 266. An inert gas supply source 262, an MFC 263 and a valve 264 are provided at the inert gas supply pipe 261 in the sequential order from an upstream side to a downstream side of the inert gas supply pipe 261. The inert gas is supplied into the first purge region 207a and the second purge region 207b through the nozzle 265 and the nozzle 266 via the inert gas supply pipe 261 provided with the MFC 263 and the valve 264. The inert gas supplied into the first purge region 207a and the second purge region 207b serves as a purge gas.

The first inert gas supply part 260 is constituted mainly by the inert gas supply pipe 261, the MFC 263, the valve 264, the nozzle 265 and the nozzle 266. The first inert gas supply part 260 may further include the inert gas supply source 262.

Subsequently, the second inert gas supply part (also referred to as a "second inert gas supply mechanism" or a "second inert gas supply system") 270 will be described with reference to FIGS. 2 and 4D. A downstream end of an inert gas supply pipe 271 is connected to the inert gas supply pipe 275. An inert gas supply source 272, an MFC 273 and a valve 274 are provided at the inert gas supply pipe 271 in the sequential order from an upstream side to a downstream side of the inert gas supply pipe 271. The inert gas is supplied into the space 284 and the vessel 204 through the inert gas supply pipe 275 via the inert gas supply pipe 271 provided with the MFC 273 and the valve 274.

The inert gas supplied into the vessel 204 is exhausted through the exhaust groove 288 via a space between the rotary table 217 and the window 285. With such a structure, it is possible to prevent the source gas and the reactive gas from flowing into the space between the rotary table 217 and the window 285.

The second inert gas supply part 270 is constituted mainly by the inert gas supply pipe 271, the MFC 273, the valve 274 and the inert gas supply pipe 275. The second inert gas supply part 270 may further include the inert gas supply source 272.

In the present specification, the inert gas may include at least one among nitrogen ($N_2$) gas and a rare gas such as helium (He) gas, neon (Ne) gas and argon (Ar) gas. Specifically, according to the first embodiment, for example, the $N_2$ gas may be used as the inert gas.

Figure 5:
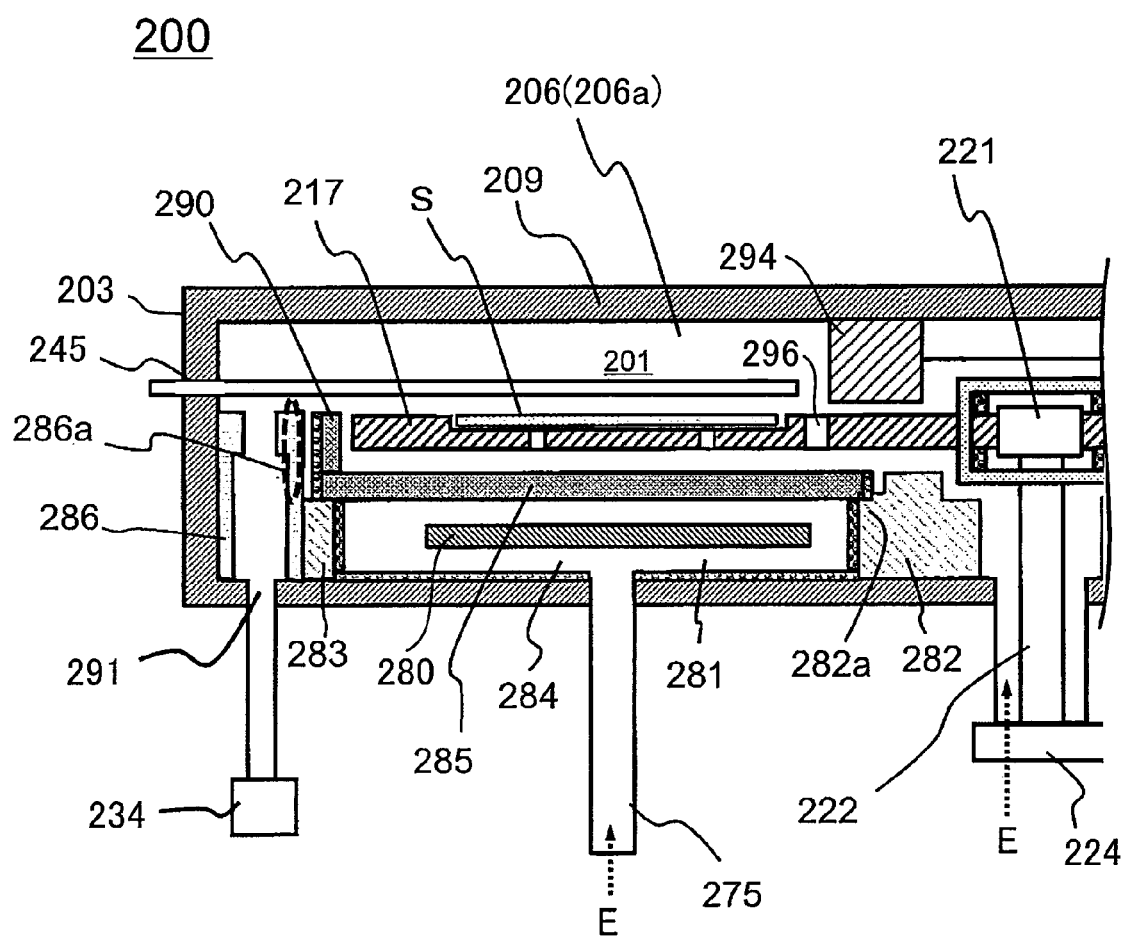
FIG. 5 schematically illustrates a vertical cross-section of the reactor for explaining an exhaust port of the reactor of the substrate processing apparatus according to the first embodiment described herein FIG. 6 schematically illustrates a nozzle according to the first embodiment described herein and a thermal decomposition amount of a source gas flowing in the nozzle according to the first embodiment described herein.

As shown in FIGS. 1, 2 and 5, the exhaust port 291 and the exhaust port 292 are provided at the process vessel 203. An exhaust port 296 serving as a second exhaust part (also referred to as a "second exhaust mechanism") is provided at the rotary table 217.

The exhaust port 291 is provided outside the rotary table 217 at a rotationally downstream side of the first process region 206a in the rotation direction "R". Thus, by exhausting (discharging) the source gas thermally decomposed and supplied to the substrate S through the first process region 206a, it is possible to suppress the influence of the thermally decomposed source gas on the substrate S. The source gas and the inert gas are mainly exhausted through the exhaust port 291. An exhaust pipe 234a which is a part of an exhaust part (also referred to as an "exhaust mechanism" or an "exhaust system") 234 is provided so as to communicate with the exhaust port 291. A vacuum pump 234b serving as a vacuum exhaust device is connected to the exhaust pipe 234a via a valve 234d serving as an opening/closing valve and an APC (Automatic Pressure Controller) valve 234c serving as a pressure controller (also referred to as a "pressure adjusting mechanism"). The vacuum pump 234b is configured to vacuum-exhaust an inner atmosphere of the process chamber 201 such that an inner pressure of the process chamber 201 reaches a predetermined pressure (vacuum degree).

The exhaust pipe 234a, the valve 234d and the APC valve 234c are collectively referred to as the exhaust part 234. The exhaust part 234 may further include the vacuum pump 234b.

The exhaust port 296 is provided closer to a center portion of the process chamber 201 than the plurality of the concave portions 217b of the rotary table 217 on which the plurality of the substrates including the substrate S are placed. By providing the exhaust port 296, the gas supplied to a center portion of the rotary table 217 is exhausted to a space below the rotary table 217 through the exhaust port 296. The gas exhausted to the space below the rotary table 217 is then exhausted through the exhaust port 291 provided at an outer portion of the process chamber 201. A partition 294 configured to separate the first process region 206a from other process region such as the second process region 206b is provided at the ceiling 209 of the first process region 206a on the center portion of the rotary table 217. As described above, the exhaust port 296 is provided closer to the center portion of the process chamber 201 than the plurality of the concave portions 217b of the rotary table 217. In addition, the exhaust port 296 is provided closer to an outer portion of the rotary table 217 than the partition 294. Thus, by exhausting (discharging) the source gas thermally decomposed and supplied to the substrate S through the first process region 206a, it is possible to suppress the influence of the thermally decomposed source gas on the substrate S. The exhaust port 296 is provided so as to communicate with the space between the rotary table 217 and the window 285. The source gas and the inert gas are mainly exhausted through the exhaust port 296.

As shown in FIGS. 1 and 2, an exhaust part 235 is provided so as to communicate with the exhaust port 292. The exhaust port 292 is provided outside the rotary table 217 at a rotationally downstream side of the second process region 206b in the rotation direction "R". The reactive gas and the inert gas are mainly exhausted through the exhaust port 292.

An exhaust pipe 235a which is a part of the exhaust part 235 is provided so as to communicate with the exhaust port 292. A vacuum pump 235b is connected to the exhaust pipe 235a via a valve 235d and an APC valve 235c. The vacuum pump 235b is configured to vacuum-exhaust the inner atmosphere of the process chamber 201 such that the inner pressure of the process chamber 201 reaches a predetermined pressure (vacuum degree).

The exhaust pipe 235a, the valve 235d and the APC valve 235c are collectively referred to as the exhaust part 235. The exhaust part 235 may further include the vacuum pump 235b.

Subsequently, the nozzle 245 will be described in detail with reference to FIGS. 1 and 6. For example, the nozzle 245 is used as a part of the source gas supply part 240 configured to supply a silicon (Si)-based $Si_2H_2Cl_2$ gas serving as the source gas to the first process region 206a.

For example, the nozzle 245 is constituted by a nozzle 245a serving as a main nozzle and nozzles 245b, 245c and 245d serving as auxiliary nozzles. For example, each of the nozzles 245a, 245b, 245c and 245d is embodied by an I-shaped nozzle, and arranged in parallel to each other in the first process region 206a. Each of the nozzles 245a through 245d is made of a cleaning resistant material such as quartz and ceramics.

Each of the nozzles 245a through 245d extends along a radial direction of the rotary table 217 from a wall 203a of the process vessel 203 toward the center portion of the rotary table 217.

A hole 255a of a round shape (hereinafter, also referred to as the round hole 255a) is provided at a front end of the nozzle 245a, which is at a downstream end of the gas flow in the nozzle 245a. The round hole 255a is provided at a side of the nozzle 245a facing the plurality of the concave portions 217b of the rotary table 217. That is, the round hole 255a is provided to face the substrate S on the rotary table 217. In addition, the nozzle 245a includes a portion 265a free of a hole. The portion 265a where no hole is provided is configured to thermally decompose the source gas. That is, the nozzle 245a includes the portion 265a provided at a side of the nozzle 245a facing the heater 280.

A hole 255b of a round shape (hereinafter, also referred to as the round hole 255b) is provided at a front end of the nozzle 245b, which is at a downstream end of the gas flow in the nozzle 245b. The round hole 255b is provided at a side of the nozzle 245b facing the plurality of the concave portions 217b of the rotary table 217. That is, the round hole 255b is provided to face the substrate S on the rotary table 217. The nozzle 245b is shorter than the nozzle 245a, and a nozzle diameter and a hole diameter of the nozzle 245b are smaller than those of the nozzle 245a. In addition, the nozzle 245b includes a portion 265b free of a hole. The portion 265b where no hole is provided is configured to thermally decompose the source gas. That is, the nozzle 245b includes the portion 265b provided at a side of the nozzle 245b facing the heater 280.

A hole 255c of a round shape (hereinafter, also referred to as the round hole 255c) is provided at a front end of the nozzle 245c, which is at a downstream end of the gas flow in the nozzle 245c. The round hole 255c is provided at a side of the nozzle 245c facing the plurality of the concave portions 217b of the rotary table 217. That is, the round hole 255c is provided to face the substrate S on the rotary table 217. The nozzle 245c is shorter than the nozzle 245b, and a nozzle diameter and a hole diameter of the nozzle 245c are smaller than those of the nozzle 245b. In addition, the nozzle 245c includes a portion 265c free of a hole. The portion 265c where no hole is provided is configured to thermally decompose the source gas. That is, the nozzle 245c includes the portion 265c provided at a side of the nozzle 245c facing the heater 280.

A hole 255d of a round shape (hereinafter, also referred to as the round hole 255d) is provided at a front end of the nozzle 245d, which is at a downstream end of the gas flow in the nozzle 245d. The round hole 255d is provided at a side of the nozzle 245d facing the plurality of the concave portions 217b of the rotary table 217. That is, the round hole 255d is provided to face the substrate S on the rotary table 217. The nozzle 245d is shorter than the nozzle 245c, and a nozzle diameter and a hole diameter of the nozzle 245d are smaller than those of the nozzle 245c. In addition, the nozzle 245d includes a portion 265d free of a hole. The portion 265d where no hole is provided is configured to thermally decompose the source gas. That is, the nozzle 245d includes the portion 265d provided at a side of the nozzle 245d facing the heater 280.

As described above, by providing the portions 265a through 265d, where no hole is provided, on the sides of the nozzles 245a through 245d facing the heater 280, respectively, the source gas supplied to each of the nozzles 245a through 245d is thermally decomposed while passing through the portions 265a through 265d of the nozzles 245a through 245d before the source gas is supplied onto the substrate S via the round holes 255a through 255d of the nozzles 245a through 245d, and the thermally decomposed source gas is supplied onto the substrate S through the round holes 255a through 255d of the nozzles 245a through 245d. That is, it is possible to thermally decompose the source gas near the substrate S and to supply the thermally decomposed source gas onto the substrate S.

As described above, a length of the nozzle 245a through 245d varies from a rotationally upstream side to a rotationally downstream side along the rotation direction "R" of the substrate S. Specifically, for example, the length of each of the nozzles 245a through 245d gradually decreases from the rotationally upstream side to the rotationally downstream side along the rotation direction "R" of the substrate S.

The nozzle diameter of each of the nozzles 245a through 245d varies from the rotationally upstream side to the rotationally downstream side along the rotation direction "R" of the substrate S. Specifically, for example, the nozzle diameter of each of the nozzles 245a through 245d gradually decreases from the upstream side to the downstream side along the rotation direction "R" of the substrate S.

The hole diameter of each of the round holes 255a through 255d of the nozzles 245a through 245d varies from the rotationally upstream side to the rotationally downstream side along the rotation direction "R" of the substrate S. Specifically, for example, the hole diameter of each of the round holes 255a through 255d of the nozzles 245a through 245d gradually decreases from the rotationally upstream side to the rotationally downstream side along the rotation direction "R" of the substrate S.

According to the first embodiment, the length of each of the nozzles 245a through 245d is proportional to the nozzle diameter of each of the nozzles 245a through 245d. That is, the nozzle provided on the rotationally upstream side in the rotation direction "R" of the substrate S is longer than the nozzle provided on the rotationally downstream side in the rotation direction "R" of the substrate S, and the nozzle diameter of the nozzle provided on the rotationally upstream side in the rotation direction "R" of the substrate S is greater than that of the nozzle provided on the rotationally downstream side in the rotation direction "R" of the substrate S. In other words, the nozzle length and the nozzle diameter are smaller on the rotationally downstream side than on the rotationally upstream side in the rotation direction "R" of the substrate S.

In addition, the nozzle diameter of each of the nozzles 245a through 245d is proportional to the hole diameter of each of the round holes 255a through 255d of the nozzles 245a through 245d. That is, the nozzle diameter and the hole diameter of the nozzle provided on the upstream side in the rotation direction "R" of the substrate S are greater than those of the nozzle provided on the downstream side in the rotation direction "R" of the substrate S, respectively. In other words, the nozzle diameter and the hole diameter of the nozzle provided on the downstream side in the rotation direction "R" of the substrate S is smaller than those of the nozzle provided on the upstream side in the rotation direction "R" of the substrate S, respectively.

That is, the nozzle diameter of the nozzle 245a, which is the longest among the nozzles 245a through 245d and extends to the vicinity of the center of the rotary table 217, is greater than that of the nozzle 245d, which is the shortest among the nozzles 245a through 245d and extends to an outer peripheral portion of the rotary table 217. Further, the hole diameter of the round hole 255a of the nozzle 245a is greater than that of the round hole 255d of the nozzle 245d.

In other words, the nozzle 245d provided on the most downstream side in the rotation direction "R" of the rotary table 217 is shorter than the nozzle 245a provided on the most upstream side in the rotation direction "R" of the rotary table 217. In addition, the nozzle diameter of the nozzle 245d provided on the most downstream side in the rotation direction "R" of the rotary table 217 is smaller than that of the nozzle 245a provided on the most upstream side in the rotation direction "R" of the rotary table 217, and the hole diameter of the round hole 255d of the nozzle 245d provided on the most downstream side in the rotation direction "R" of the rotary table 217 is smaller than that of the round hole 255a of the nozzle 245a provided on the most upstream side in the rotation direction "R" of the rotary table 217.

The round holes 255a through 255d are configured such that the source gas can be supplied to different positions on the substrate S of the rotary table 217 in the radial direction of the substrate S. Then, the thermally decomposed source gas supplied through the round holes 255a through 255d is discharged through the exhaust port 291 and the exhaust port 296.

As a temperature of the apparatus (for example, an inner temperature of the process chamber 201) increases, the thermal decomposition of the source gas is accelerated in the radial direction of the substrate S in the nozzles 245a through 245d, and propagates from the upstream sides to the downstream sides of the nozzles 245a through 245d in which the source gas flows. That is, as shown in FIG. 6, an amount of the thermal decomposition (also simply referred to as a "thermal decomposition amount") of the source gas flowing in each of the nozzles 245a through 245d gradually increases from the upstream sides to the downstream sides of the nozzles 245a through 245d as the source gas flows from the upstream sides to the downstream sides of the nozzles 245a through 245d.

According to the first embodiment, as described above, the nozzles 245a through 245d include the portions 265a through 265d where no hole is provided, respectively, and the length, the nozzle diameter and the hole diameter of each of the nozzles 245a through 245d are different from each other. As shown in FIG. 6, the main nozzle (245a) is provided with the hole (255a) at a front end thereof, wherein a length of the hole-free portion (265a) of the main nozzle (245a) is longer than a length of the other portion of the main nozzle (245a) where the hole (255a) is formed. Further, each of the auxiliary nozzles (245b, 245c, 245d) is provided with the hole (255b, 255c or 255d) at a front end thereof, wherein a length of the hole-free portion (265b, 265c or 265d) of each of the auxiliary nozzles (245b, 245c, 245d) is longer than a length of the other portion of each of the auxiliary nozzles (245b, 245c, 245d) where the hole (255b, 255c or 255d) is formed.

Figure 7:
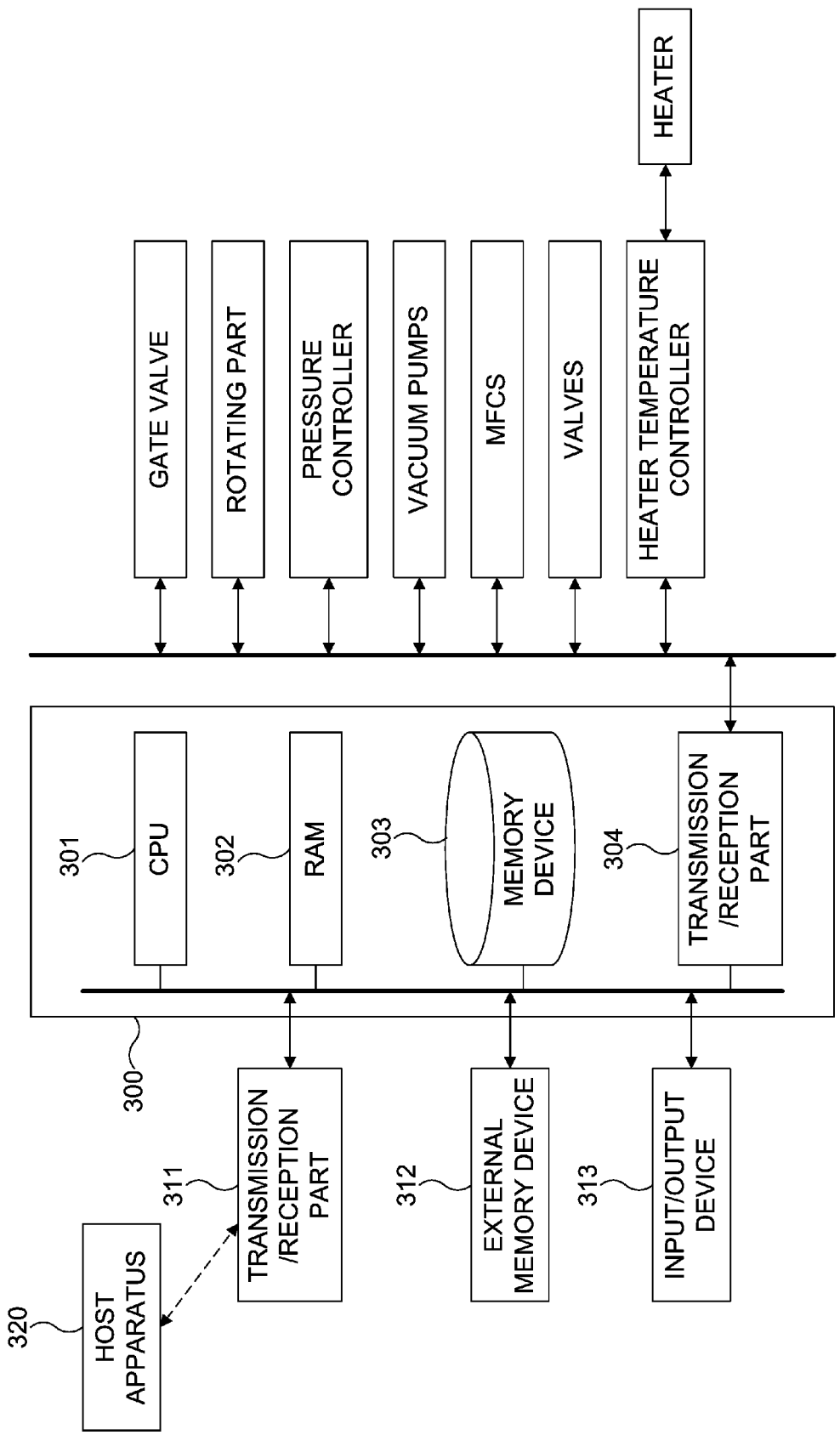
FIG. 7 is a block diagram schematically illustrating a configuration of a controller and related components of the substrate processing apparatus according to the first embodiment described herein.

The source gas supplied to each of the nozzles 245a through 245d is thermally decomposed while passing through each of the portions 265a through 265d. That is, by respectively providing the portions 265a through 265d, where no hole is provided, at the nozzles 245a through 245d having different lengths, nozzle diameters and hole diameters, it is possible to supply the thermally decomposed source gas onto the substrate S. That is, the length of each of the nozzles 245a through 245d (or the length of each of the portions 265a through 265d where no hole is provided), the nozzle diameter of each of the nozzles 245a through 245d and the hole diameter of each of the nozzles 245a through 245d are adjusted such that a thermal decomposition amount of the source gas supplied through the round hole 255a of the nozzle 245a, a thermal decomposition amount of the source gas supplied through the round hole 255b of the nozzle 245b, a thermal decomposition amount of the source gas supplied through the round hole 255c of the nozzle 245c and a thermal decomposition amount of the source gas supplied through the round hole 255d of the nozzle 245d become substantially equal to one another. As described above, by using the nozzles having different nozzle lengths, nozzle diameters and hole diameters and including the portions where no hole is provided, it is possible to uniformize the thermal decomposition amount of the source gas supplied onto the substrate S through each of the nozzles. Then, by supplying the source gas uniformly subjected to thermal decomposition onto the substrate S in the radial direction of the substrate S, it is possible to improve a uniformity of the characteristics of the film formed on the surface of the substrate S The reactor 200 includes the controller 300 configured to control the operations of the components of the substrate processing apparatus. As shown in FIG. 7, the controller 300 includes at least a CPU (Central Processing Unit) 301 serving as an arithmetic unit, a RAM (Random Access Memory) 302 serving as a temporary memory device, a memory device 303 and a transmission/reception part 304. The controller 300 is connected to the components of the substrate processing apparatus via the transmission/reception part 304, calls a program or a recipe from the memory device 303 in accordance with an instruction from a host controller or a user, and controls the operations of the components of the substrate processing apparatus according to the contents of the instruction. The controller 300 may be embodied by a dedicated computer or by a general-purpose computer. According to the first embodiment, for example, the controller 300 may be embodied by preparing an external memory device 312 storing the program and by installing the program onto the general-purpose computer using the external memory device 312. For example, the external memory device 312 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. The means for providing the program to the computer is not limited to the external memory device 312. For example, the program may be supplied to the computer (general-purpose computer) using communication means such as the Internet and a dedicated line. The program may be provided to the computer without using the external memory device 312 by receiving the information (that is, the program) from a host apparatus 320 via a transmission/reception part 311. In addition, a user can input an instruction to the controller 300 using an input/output device 313 such as a keyboard and a touch panel.

The memory device 303 or the external memory device 312 may be embodied by a non-transitory computer readable recording medium. Hereafter, the memory device 303 and the external memory device 312 may be collectively referred to as the recording medium. In the present specification, the term "recording medium" may refer to only the memory device 303, may refer to only the external memory device 312 or may refer to both of the memory device 303 and the external memory device 312.

The CPU 301 is configured to read a control program from the memory device 303 and execute the read control program. Furthermore, the CPU 301 is configured to read the recipe such as a process recipe from the memory device 303 according to an operation command inputted from the input/output device 313. According to the contents of the read recipe, the CPU 301 may be configured to control the operations of the components of the substrate processing apparatus.

(2) Substrate Processing

Figure 8:
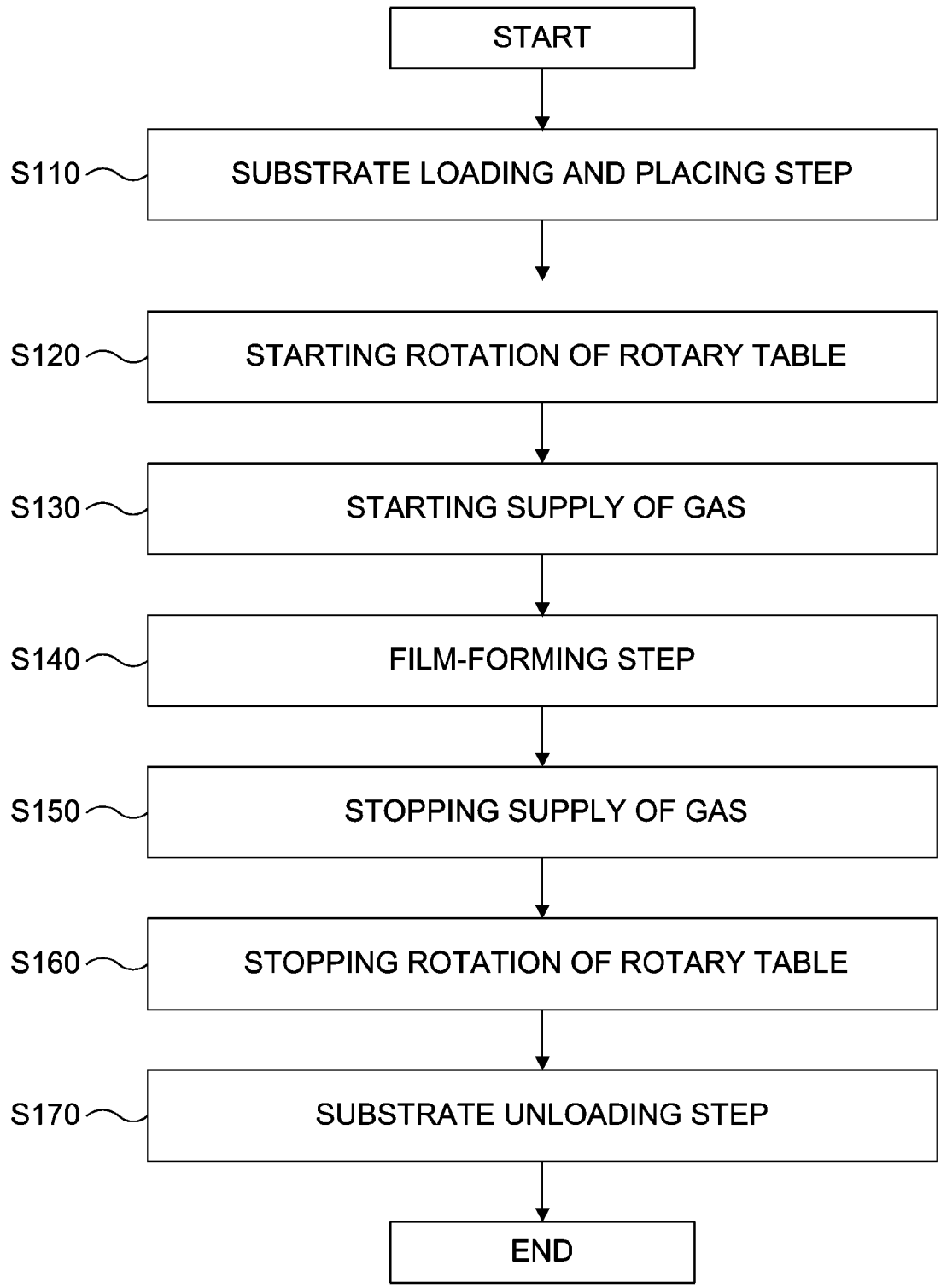
FIG. 8 is a flow chart schematically illustrating a substrate processing according to the first embodiment described herein.
Figure 9:
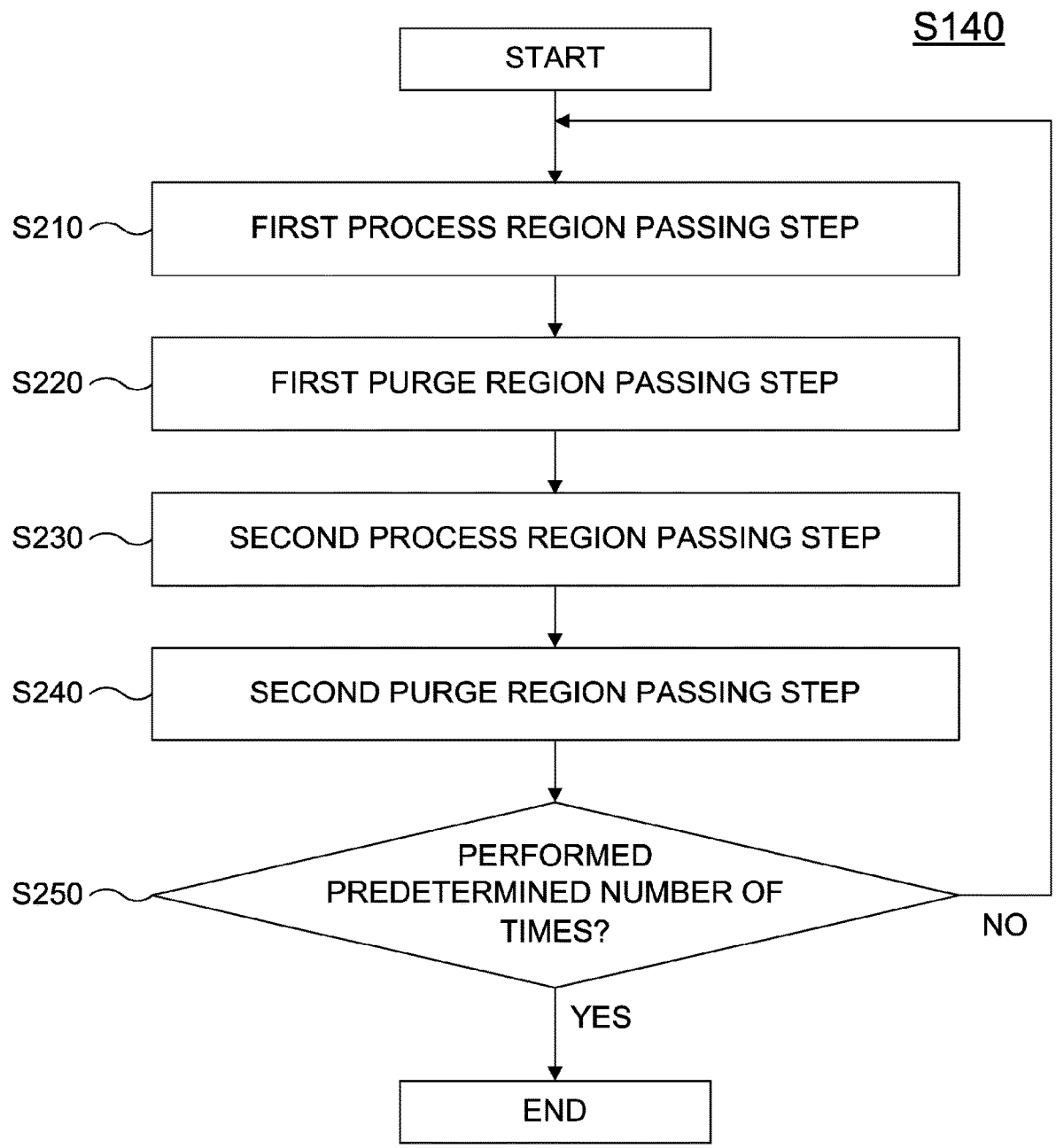
FIG. 9 is a flow chart schematically illustrating a film-forming step of the substrate processing according to the first embodiment described herein.

Subsequently, the substrate processing according to the first embodiment will be described with reference to FIGS. 8 and 9. FIG. 8 is a flow chart schematically illustrating the substrate processing according to the first embodiment described herein. FIG. 9 is a flow chart schematically illustrating a film-forming step of the substrate processing according to the first embodiment described herein. In the following description, the operations of the components of the substrate processing apparatus (and the reactor 200) are controlled by the controller 300.

The substrate processing according to the first embodiment will be described by way of an example in which a silicon nitride (SiN) film serving as the film is formed on the substrate S by using the $Si_2H_2Cl_2$ gas as the source gas and the $NH_3$ gas as the reactive gas.

A substrate loading and placing step S110 will be described. In the reactor 200, the pins 219 are elevated such that the pins 219 pass through the through-holes 217a of the rotary table 217. As a result, the pins 219 protrude from the surface of the rotary table 217 by a predetermined height. Subsequently, the gate valve 205 is opened, and the substrate S is placed on the pins 219 as shown in FIG. 3 by using a substrate transfer device (not shown). After the substrate S is placed on the pins 219, by lowering the pins 219, the substrate S is placed on one of the concave portions 217b.

The rotary table 217 is rotated until one of the concave portions 217b, where the substrate S is not placed, faces the gate valve 205. Thereafter, one of the substrates is placed on the above-mentioned one of the concave portions 217b. An operation described above is repeated until the plurality of the substrates including the substrate S are placed on all of the concave portions 217b.

After the plurality of the substrates including the substrate S are placed on all of the concave portions 217b, the substrate transfer device is retracted out of the reactor 200, and the gate valve 205 is closed to seal the process vessel 203.

When the plurality of the substrates including the substrate S are loaded into the process chamber 201, it is preferable that the $N_2$ gas is supplied into the process chamber 201 by the first inert gas supply part 260 while exhausting the process chamber 201 by the exhaust parts 234 and 235. Thereby, it is possible to suppress the particles from entering the process chamber 201 and from adhering onto the plurality of the substrates including the substrate S. The vacuum pumps 234b and 235b may be continuously operated from the substrate loading and placing step S110 until at least a substrate unloading step S170 described later is completed.

When the substrate S is placed on the rotary table 217, the electric power is supplied to the heater 280 in advance such that a temperature (surface temperature) of the substrate S is adjusted to a predetermined temperature. For example, the predetermined temperature of the substrate S according to the first embodiment may range from the room temperature to 650° C., preferably from the room temperature to 400° C. The electric power may be continuously supplied to the heater 280 from the substrate loading and placing step S110 until at least the substrate unloading step S170 described later is completed.

In the substrate loading and placing step S110, the inert gas is supplied to the process vessel 203 and the heater mechanism 281 through the second inert gas supply part 270. The inert gas may be continuously supplied through the second inert gas supply part 270 from the substrate loading and placing step S110 until at least the substrate unloading step S170 described later is completed.

A step S120 of starting the rotation of the rotary table 217 will be described. After the plurality of the substrates including the substrate S are placed on all of the concave portions 217b, the controller 300 controls the rotating part 224 to rotate the rotary table 217 in the "R" direction shown in FIG. 1. By rotating the rotary table 217, the substrate S is moved to the first process region 206a, the first purge region 207a, the second process region 206b and the second purge region 207b sequentially in this order.

A step S130 of starting the supply of the gas will be described. When the substrate S is heated to a desired temperature and the rotary table 217 reaches a desired rotation speed, the valve 244 is opened to start the supply of the $Si_2H_2Cl_2$ gas into the first process region 206a. In parallel with the supply of the $Si_2H_2Cl_2$ gas, the valve 254 is opened to supply the $NH_3$ gas into the second process region 206b.

In the step S130, a flow rate of the $Si_2H_2Cl_2$ gas is adjusted by the MFC 243 to a predetermined flow rate. For example, the predetermined flow rate of the $Si_2H_2Cl_2$ gas in the step S130 may range from 50 sccm to 500 sccm.

In the step S130, a flow rate of the $NH_3$ gas is adjusted by the MFC 253 to a predetermined flow rate. For example, the predetermined flow rate of the $NH_3$ gas in the step S130 may range from 100 sccm to 5,000 sccm.

In addition, after the substrate loading and placing step S110, the process chamber 201 is exhausted by the exhaust parts 234 and 235 and the $N_2$ serving as the purge gas is supplied into the first purge region 207a and the second purge region 207b through the first inert gas supply part 260. In addition, by appropriately adjusting valve opening degrees of the APC valve 234c and the APC valve 235c, the inner pressure of the process chamber 201 is adjusted to a predetermined pressure.

A film-forming step S140 will be described. Here, a basic flow of the film-forming step S140 will be described, and the film-forming step S140 will be described in detail later. In the film-forming step S140, a silicon-containing layer is formed on the substrate S in the first process region 206a. After the substrate S is rotated to the second process region 206b, by reacting the silicon-containing layer with the $NH_3$ gas in the second process region 206b, a silicon nitride (SiN) film is formed on the substrate S. The rotary table 217 is rotated a predetermined number of times so that the SiN film of a desired thickness is obtained.

A step S150 of stopping the supply of the gas will be described. After the rotary table 217 is rotated the predetermined number of times, the valve 244 is closed to stop the supply of the $Si_2H_2Cl_2$ gas to the first process region 206a and the valve 254 is closed to stop the supply of the $NH_3$ gas to the second process region 206b.

A step S160 of stopping the rotation of the rotary table 217 will be described. After the supply of the $Si_2H_2Cl_2$ gas and the supply of the $NH_3$ gas are stopped according to the step S150, the rotation of the rotary table 217 is stopped in the step S160.

The substrate unloading step S170 will be described. The rotary table 217 is rotated to move the substrate S to the position facing the gate valve 205. Thereafter, the substrate S is supported on the pins 219 in the same manner as when the substrate S is loaded. After the substrate S is supported on the pins 219, the gate valve 205 is opened, and the substrate S is unloaded (transferred) out of the process vessel 203 using the substrate transfer device (not shown). An operation described above is repeated until all of the plurality of the substrates are unloaded out of the process vessel 203. After all of the plurality of the substrates are unloaded, the supply of the inert gas by the first inert gas supply part 260 and the second inert gas supply part 270 is stopped.

Subsequently, the film-forming step S140 will be described in detail with reference to FIG. 9. The film-forming step S140 will be mainly described based on the substrate S among the plurality of the substrates placed on the rotary table 217 from a first process region passing step S210 to a second purge region passing step S240.

As shown in FIG. 9, during the film-forming step S140, the plurality of the substrates including the substrate S pass through the first process region 206a, the first purge region 207a, the second process region 206b and the second purge region 207b sequentially in this order as the rotary table 217 is rotated.

The first process region passing step S210 will be described. As the substrate S passes through the first process region 206a, the $Si_2H_2Cl_2$ gas is supplied to the substrate S. When the substrate S passes through the first process region 206a, since there is no reactive gas in the first process region 206a, the $Si_2H_2Cl_2$ gas directly contacts (adheres) to the surface of the substrate S without reacting with the reactive gas. Thereby, the first layer is formed on the surface of the substrate S.

A first purge region passing step S220 will be described. After passing through the first process region 206a, the substrate S moves to the first purge region 207a. When the substrate S passes through the first purge region 207a, components of the $Si_2H_2Cl_2$ gas which are not strongly adhered to the substrate S in the first process region 206a are removed from the substrate S by the inert gas.

A second process region passing step S230 will be described. After passing through the first purge region 207a, the substrate S moves to the second process region 206b. When the substrate S passes through the second process region 206b, the first layer reacts with the $NH_3$ gas serving as the reactive gas in the second process region 206b. Thereby, a second layer containing at least silicon (Si) and nitrogen (N) is formed on the substrate S.

The second purge region passing step S240 will be described. After passing through the second process region 206b, the substrate S moves to the second purge region 207b. When the substrate S passes through the second purge region 207b, gases such as HCl desorbed from the second layer on the substrate S in the second process region 206b and surplus $H_2$ gas are removed from the substrate S by the inert gas.

As described above, at least two gases reacting with each other are sequentially supplied to the substrate S. A cycle of the first embodiment includes the first process region passing step S210, the first purge region passing step S220, the second process region passing step S230 and the second purge region passing step S240.

A determination step S250 will be described. In the determination step S250, the controller 300 determines whether the cycle including the first process region passing step S210, the first purge region passing step S220, the second process region passing step S230 and the second purge region passing step S240 has been performed a predetermined number of times. Specifically, the controller 300 counts the number of the rotation of the rotary table 217.

When the cycle has not been performed the predetermined number of times ("NO" in the step S250 of FIG. 9), the rotary table 217 is rotated and the cycle including the first process region passing step S210, the first purge region passing step S220, the second process region passing step S230 and the second purge region passing step S240 is repeated. By performing the cycle the predetermined number of times, it is possible to form the film on the substrate S.

When the cycle has been performed the predetermined number of times ("YES" in the step S250 of FIG. 9), the film-forming step S140 is terminated. As described above, it is possible to form the film on the substrate S with a predetermined thickness by performing the cycle the predetermined number of times

(3) Effects According to First Embodiment

According to the first embodiment described above, it is possible to provide at least one or more of the following effects.

(a) It is possible to suppress a non-uniformity of the film formed on the substrate S due to the thermal decomposition of the source gas in the nozzle. That is, it is possible to improve the uniformity of the thickness of the film formed on the surface of the substrate S.

(b) By providing the portions, where no hole is provided, on the sides of the nozzles facing the heater, respectively, it is possible to thermally decompose the source gas near the substrate S and to supply the thermally decomposed source gas onto the substrate S.

(c) By using the nozzles having different nozzle lengths, nozzle diameters and hole diameters and including the portions where no hole is provided, it is possible to uniformize the thermal decomposition amount of the source gas supplied onto the substrate S.

(d) By providing the exhaust ports outside the rotary table and closer to the center portion of the process chamber than the plurality of the concave portions of the rotary table and by exhausting the source gas thermally decomposed and supplied to the substrate S in the first process region 206a, it is possible to suppress the influence of the thermally decomposed source gas staying in the first process region 206a on the substrate S.

(4) Other Embodiments

While the first embodiment is described in detail, the above-described technique is not limited thereto. For example, features such as the number of the nozzles constituting the nozzle 245, the shape of the hole of each of the nozzles, the number of the hole of each of the nozzles and the size of the hole of each of the nozzles are not limited to the first embodiment described above. For example, the features may be modified as in the following embodiments. Hereinafter, the following embodiments will be mainly described based on the differences between the first embodiment and the following embodiments. According to the following embodiments, it is possible to obtain the same effects as those of the first embodiment.

Second Embodiment

Figure 10:
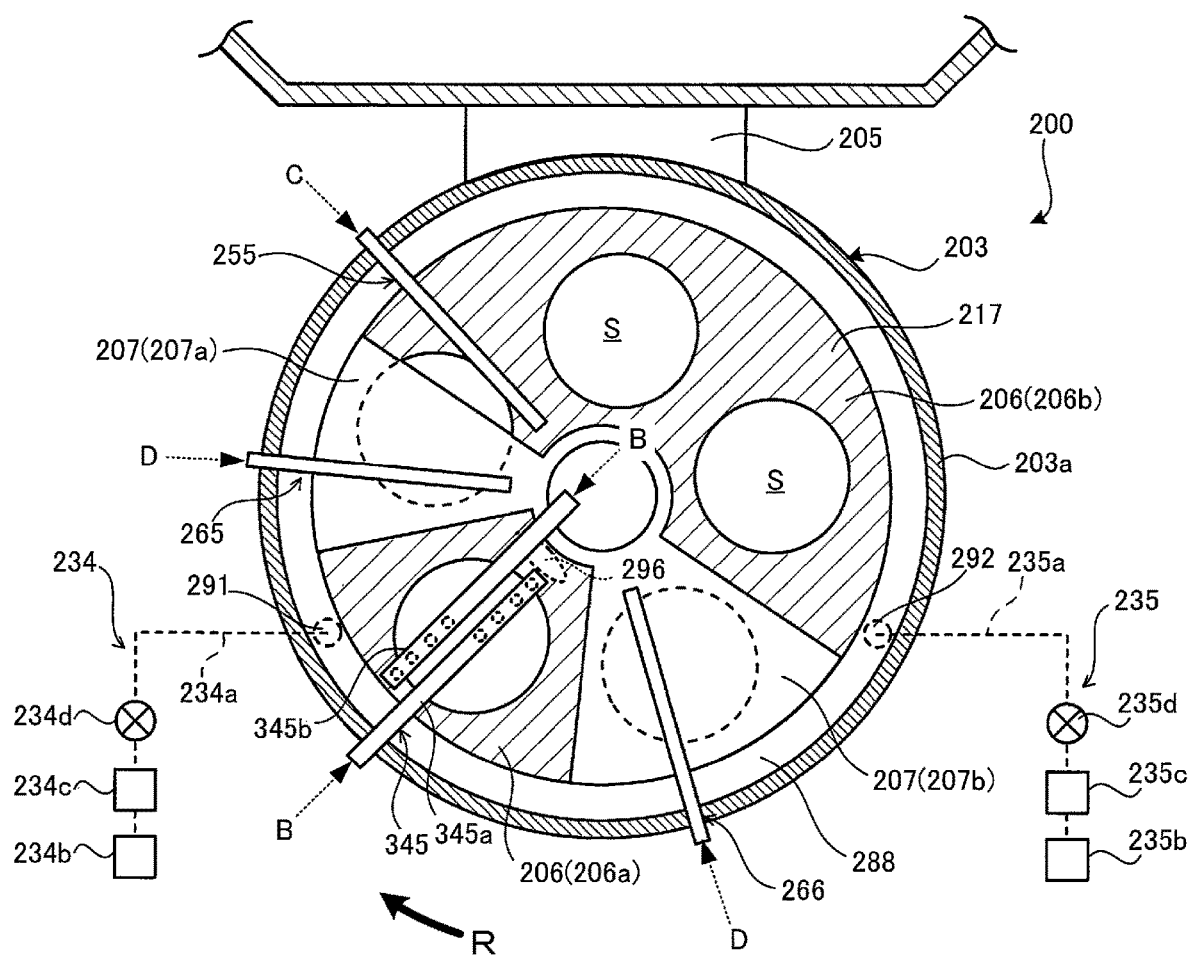
FIG. 10 schematically illustrates a horizontal cross-section of a reactor of a substrate processing apparatus according to a second embodiment described herein.
Figure 11A:
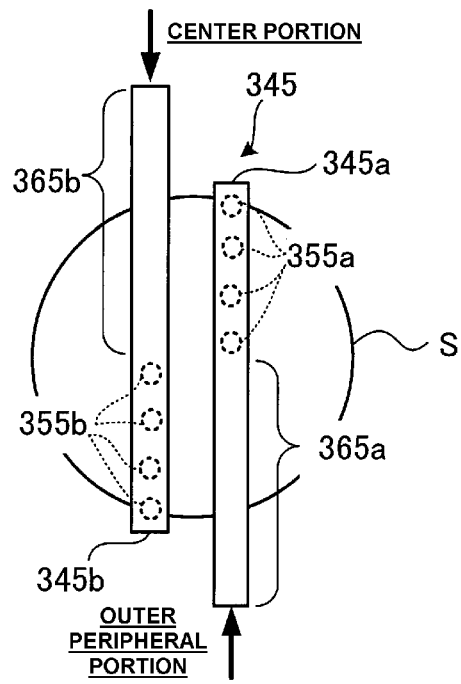
FIG. 11A schematically illustrates nozzles of the substrate processing apparatus according to the second embodiment described herein when viewed from above.
Figure 11B:
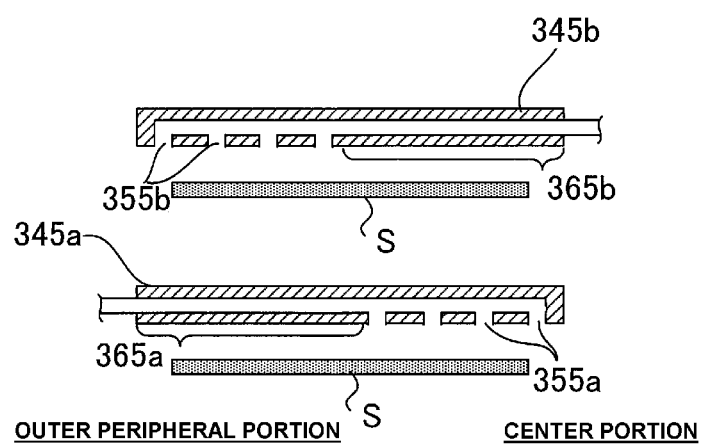
FIG. 11B schematically illustrates vertical cross-sections of the nozzles of the substrate processing apparatus according to the second embodiment described herein.

According to a second embodiment, as shown in FIGS. 10, 11A and 11B, a nozzle 345 is used instead of the nozzle 245 described above.

For example, the nozzle 345 is constituted by a nozzle 345a serving as a main nozzle and a nozzle 345b serving as an auxiliary nozzle. For example, each of the nozzles 345a and 345b is embodied by an I-shaped nozzle, and arranged in parallel to each other in the first process region 206a. The nozzles 345a and 345b are configured to extend above the plurality of the concave portions 217b of the rotary table 217 (that is, above the substrate S). The gas supply pipe 241 is connected to the nozzle 345a on the outer peripheral portion of the rotary table 217, and the nozzle 345a is configured to supply the source gas through an outer peripheral portion of the process chamber 201 (that is, through the outer peripheral portion of the rotary table 217). The gas supply pipe 241 is connected to the nozzle 345b on the center portion of the rotary table 217, and the nozzle 345b is configured to supply the source gas through the center portion of the process chamber 201 (that is, through the center portion of the rotary table 217). For example, the nozzle 345b may be fixed to the ceiling 209 of the first process region 206a.

A plurality of holes (for example, four holes according to the second embodiment) 355a of a round shape (hereinafter, also referred to as the round holes 355a) are provided at a front end of the nozzle 345a, which is at a downstream end of the gas flow in the nozzle 345a. The round holes 355a are provided at a side of the nozzle 345a facing the plurality of the concave portions 217b of the rotary table 217. That is, the round holes 355a are provided to face the substrate S on the rotary table 217. In addition, the nozzle 345a includes a portion 365a free of a hole, which is at an upstream side of the gas flow in the nozzle 345a. The portion 365a where no hole is provided is configured to thermally decompose the source gas. That is, the nozzle 345a includes the portion 365a provided at a side of the nozzle 345a facing the heater 280.

A plurality of holes (for example, four holes according to the second embodiment) 355b of a round shape (hereinafter, also referred to as the round holes 355b) are provided at a front end of the nozzle 345b, which is at a downstream end of the gas flow in the nozzle 345b. The round holes 355b are provided at a side of the nozzle 345b facing the plurality of the concave portions 217b of the rotary table 217. That is, the round holes 355b are provided to face the substrate S on the rotary table 217. In addition, the nozzle 345b includes a portion 365b free of a hole, which is at an upstream side of the gas flow in the nozzle 345b. The portion 365b where no hole is provided is configured to thermally decompose the source gas. That is, the nozzle 345b includes the portion 365b provided at a side of the nozzle 345b facing the heater 280.

As described above, by providing the portions 365a and 365b, where no hole is provided, on the sides of the nozzles 345a and 345b facing the heater 280, respectively, it is possible to thermally decompose the source gas near the substrate S and to supply the thermally decomposed source gas onto the substrate S.

The nozzle 345a extends along the radial direction of the rotary table 217 from the wall 203a of the process vessel 203 toward the center portion of the rotary table 217. The nozzle 345b extends along the radial direction of the rotary table 217 from the center portion of the rotary table 217 toward the wall 203a of the process vessel 203. The round holes 355a and the round holes 355b are arranged at different positions along the radial direction of the substrate S, respectively. Therefore, by differentiating supply positions of the source gas to be opposite to each other as described above, it is possible to make a heating distance to the round holes 355a in the nozzle 345a be equal to a heating distance to the round holes 355b in the nozzle 345b. It is also possible to uniformize the thermal decomposition amount of the source gas on the center portion and the thermal decomposition amount of the source gas on the outer peripheral portion of the rotary table 217 (that is, to adjust the thermal decomposition amount of the source gas on the center portion and the thermal decomposition amount of the source gas on the outer peripheral portion of the rotary table 217 to be approximately the same).

Figure 11C:
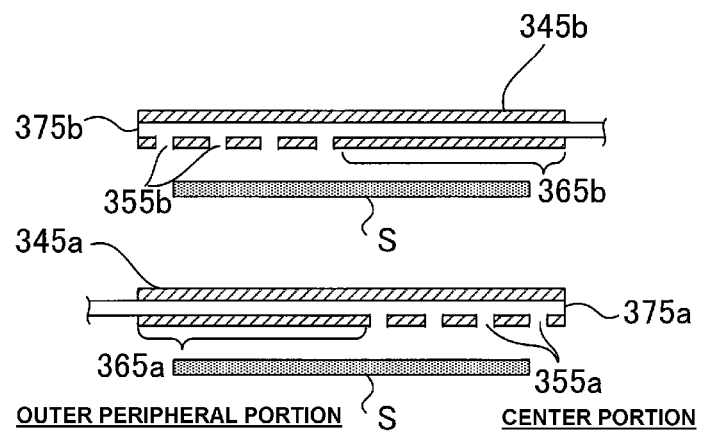
FIG. 11C schematically illustrates vertical cross-sections of nozzles of the substrate processing apparatus according to a modified example of the second embodiment described herein.

In addition, for example, as shown in FIG. 11C, opening portions 375a and 375b may be provided at the front ends of the nozzles 345a and 345b, respectively, which is at the downstream ends of the gas flow in the nozzles 345a and 345b. As described above, by configuring the front ends of the nozzles 345a and 345b to be open, it is possible to suppress the gas such as the source gas from staying in the nozzles 345a and 345b. In particular, it is possible to remove and discharge the thermally decomposed source gas from the nozzles 345a and 345b. Thereby, it is possible to suppress the generation of the particles in the process chamber 201.

Modified Example

Figure 12:
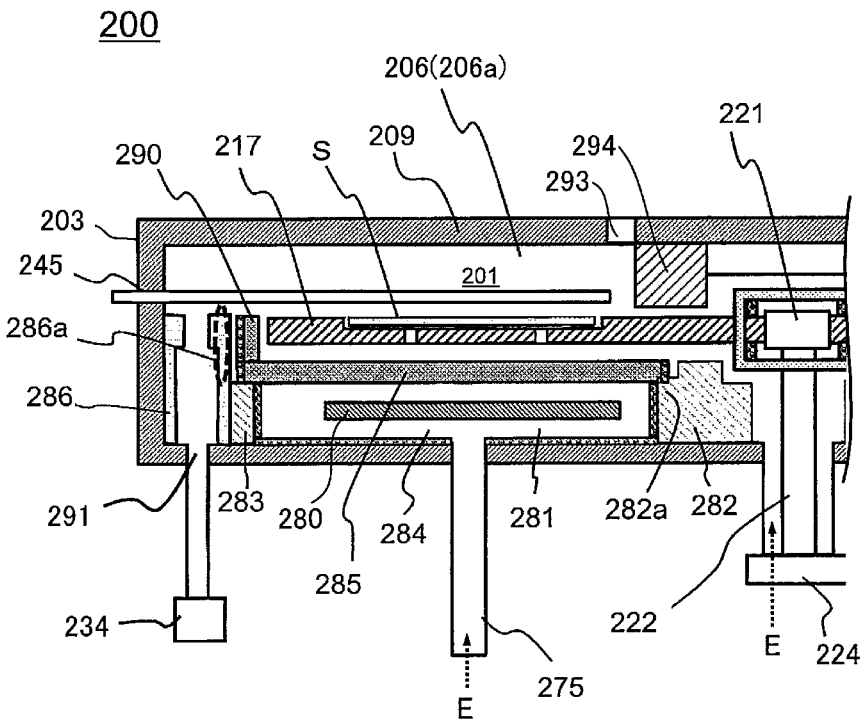
FIG. 12 schematically illustrates a vertical cross-section of a reactor for explaining an exhaust port of the reactor of the substrate processing apparatus according to a modified example of the first embodiment described herein FIG. 13 schematically illustrates a vertical cross-section of a reactor for explaining an exhaust port of the reactor of the substrate processing apparatus according to another modified example of the first embodiment described herein

Subsequently, a modified example of the first embodiment in which the exhaust port 296 provided on the center portion of the process chamber 201 of the reactor 200 of the substrate processing apparatus will be described with reference to FIG. 12.

According to the modified example of the first embodiment, instead of the exhaust port 296 provided at the rotary table 217, an exhaust port 293 serving as a second exhaust part is provided at the ceiling 209 closer to the center portion of the process chamber 201 and the center portion of the rotary table 217 than the plurality of the concave portions 217b of the rotary table 217 on which the plurality of the substrates including the substrate S are placed.

That is, the exhaust port 291 is provided outside the rotary table 217 of the first process region 206a, and the exhaust port 293 is provided on the center portion of the rotary table 217 in the first process region 206a and at the ceiling 209 outside the partition 294. As a result, it is possible to discharge the source gas on the center portion of the rotary table 217 thermally decomposed and supplied to the substrate S and the source gas on the outer peripheral portion of the rotary table 217 thermally decomposed and supplied to the substrate S from the first process region 206a through the exhaust ports 293 and 291, respectively. Thereby, it is possible to suppress the influence of the thermally decomposed source gas staying in the first process region 206a on the substrate S.

Figure 13:
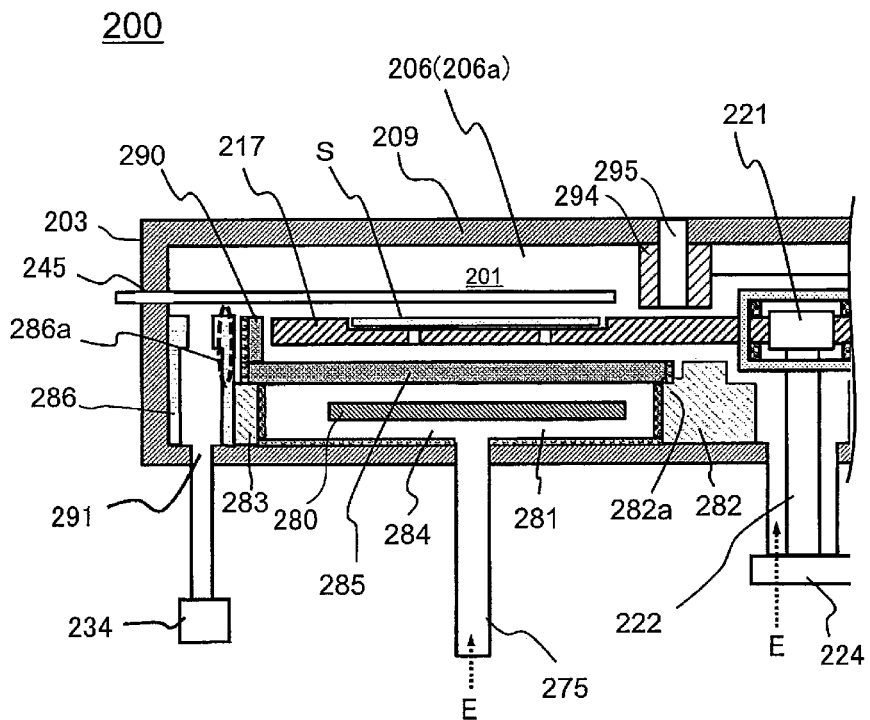

As shown in FIG. 13, an exhaust port 295 serving as a second exhaust part may be provided at the partition 294. The partition 294 is provided closer to the center portion of the process chamber 201 than the plurality of the concave portions 217b of the rotary table 217 on which the plurality of the substrates including the substrate S are placed. The partition 294 is provided on a surface of the ceiling 209 facing the rotating shaft of the rotary table 217.

That is, the exhaust port 291 is provided outside the rotary table 217 of the first process region 206a, and the exhaust port 295 is provided at the partition 294 provided at the ceiling 209 of the first process region 206a on the center portion of the rotary table 217. As a result, it is possible to discharge the source gas on the center portion of the rotary table 217 thermally decomposed and supplied to the substrate S and the source gas on the outer peripheral portion of the rotary table 217 thermally decomposed and supplied to the substrate S from the first process region 206a through the exhaust ports 295 and 291, respectively. Thereby, it is possible to suppress the influence of the thermally decomposed source gas staying in the first process region 206a on the substrate S.

While the technique is described in detail by way of the above-described embodiments, the above-described technique is not limited thereto. The above-described technique may be modified in various ways without departing from the gist thereof.

For example, the above-described embodiments are described by way of an example in which the round hole (or the round holes) may be provided at the nozzles configured to supply the source gas. However, the above-described technique is not limited thereto. For example, the round hole (or the round holes) may be replaced by a hole (or holes) of an elongated shape or a slit shape.

For example, the above-described embodiments are described by way of an example in which the length of each of the nozzles 245a through 245d gradually decreases from the rotationally upstream side to the rotationally downstream side along the rotation direction "R" of the substrate S. However, the above-described technique is not limited thereto. For example, the length of each of the nozzles 245a through 245d may gradually increase from the rotationally upstream side to the rotationally downstream side along the rotation direction "R" of the substrate S.

For example, the above-described embodiments are described by way of an example in which the nozzle diameter of each of the nozzles 245a through 245d gradually decreases from the rotationally upstream side to the rotationally downstream side along the rotation direction "R" of the substrate S. However, the above-described technique is not limited thereto. For example, the nozzle diameter of each of the nozzles 245a through 245d may gradually increase from the rotationally upstream side to the rotationally downstream side along the rotation direction "R" of the substrate S.

For example, the above-described embodiments are described by way of an example in which the SiN film serving as a nitride film is formed on the substrate S by using the $Si_2H_2Cl_2$ gas as the source gas and the $NH_3$ gas as the reactive gas. However, the above-described technique is not limited thereto. For example, instead of the $Si_2H_2Cl_2$ gas, a gas such as $SiH_4$, $Si_2H_6$, $Si_3H_8$, aminosilane and TSA gas may be used as the source gas. For example, $O_2$ gas may be used as the reactive gas instead of the $NH_3$ gas to form an oxide film instead of the nitride film. The above-described technique may also be applied to form various films on the substrate S. For example, a nitride film such as a tantalum nitride (TaN) film and a titanium nitride (TiN) film, an oxide film such as a hafnium oxide (HfO) film, a zirconium oxide (ZrO) film, a titanium oxide (TiO) film and a silicon oxide (SiO) film or a metal film containing a metal element such as ruthenium (Ru), nickel (Ni) and tungsten (W) may be formed on the substrate S according to the above-described technique. When the TiN film or the TiO film is formed, for example, a gas such as tetrachlorotitanium ($TiCl_4$) gas may be used as the source gas.

According to some embodiments in the present disclosure, it is possible to improve the uniformity of the characteristics of the film formed on the surface of the substrate by the rotary type apparatus.

What is claimed is:

1. A substrate processing apparatus comprising:
   a process chamber in which a substrate is processed;
   a substrate support provided in the process chamber and comprising a plurality of placement parts on which the substrate is placed;
   a rotating part configured to rotate the substrate support;
   a heater provided below or within the substrate support and configured to heat the substrate;

a plurality of nozzles including a main nozzle and a plurality of auxiliary nozzles;

the main nozzle provided above a placement part among the plurality of the placement parts so as to face the placement part and comprising a first portion where no hole is provided such that a process gas is thermally decomposed while passing through the first portion; and the plurality of auxiliary nozzles, each of the plurality of auxiliary nozzles are provided above the placement part so as to face the placement part and arranged in parallel with the main nozzle, each of the plurality of auxiliary nozzle comprise a second portion where no hole is provided such that the process gas is thermally decomposed while passing through the second portion, wherein the first portion and the second portion are provided at positions facing the heater, wherein a length of the main nozzle, provided on a rotationally upstream side in a rotation direction of the substrate, is longer than each of the plurality of auxiliary nozzles provided or a rotationally downstream side of the substrate, and a length of each of the plurality of nozzles is proportional to a nozzle diameter of each of the plurality of the nozzles, and the nozzle diameter of each of the plurality of nozzles is proportional to a diameter of a hole provided at each of the nozzles, such that a thermal decomposition of the process gas flowing through each of the plurality of nozzles increases from an upstream side to a downstream side as the process gas flows from the upstream side to the downstream side of each of the plurality of nozzles.

2. The substrate processing apparatus of claim 1, wherein a length of each of the plurality of nozzles gradually decreases from the rotationally upstream side to the rotationally downstream side along the rotation direction of the substrate.

3. The substrate processing apparatus of claim 1, wherein the nozzle diameter of each of the plurality of nozzles gradually decreases from the rotationally upstream side to the rotationally downstream side along the rotation direction of the substrate.

4. The substrate processing apparatus of claim 1, wherein the nozzle diameter of each of the plurality of nozzles gradually increases from the rotationally upstream side to the rotationally downstream side along the rotation direction of the substrate.

5. The substrate processing apparatus of claim 1, further comprising:

a gas supply pipe configured to supply the process gas, wherein the plurality of nozzles are connected to the gas supply pipe such that one among the plurality of nozzles is configured to supply the process gas via an outer peripheral portion of the process chamber and an other among the plurality of nozzles is configured to supply the process gas via a center portion of the process chamber.

6. The substrate processing apparatus of claim 1, wherein front ends of the plurality of nozzles are configured to be open.

7. The substrate processing apparatus of claim 1, further comprising:

a first exhaust part provided outside the substrate support and configured to exhaust the process gas.

8. The substrate processing apparatus of claim 7, further comprising:

a second exhaust part provided closer to a center portion of the process chamber than the substrate and configured to exhaust the process gas.

9. The substrate processing apparatus of claim 8, wherein the second exhaust part is provided at a ceiling of the process chamber.

10. The substrate processing apparatus of claim 8, wherein the second exhaust part is provided at a partition, and the partition is provided at the center portion of the process chamber and on a surface of a ceiling of the process chamber facing a rotating shaft of the substrate support.

11. The substrate processing apparatus of claim 8, wherein the second exhaust part is provided closer to the center portion of the process chamber than the plurality of the placement parts of the substrate support.

12. The substrate processing apparatus of claim 1, wherein the main nozzle comprises a first hole at a front end thereof, a length of the first portion is longer than a length of a first hole portion of the main nozzle where the first hole is formed, and each of the plurality of auxiliary nozzles comprise a second hole at a front end thereof, a length of the second portion is longer than a length of a second hole portion of each of the plurality of auxiliary nozzles where the second hole is formed.

13. The substrate processing apparatus of claim 1, wherein a length of the first portion and a length of the second portion are configured to be adjusted such that a thermal decomposition amount of the process gas supplied through the main nozzle is substantially equal to a thermal decomposition amount of the process gas supplied through each of the plurality of auxiliary nozzles.

* * * * *